(12) United States Patent
Choi

(10) Patent No.: US 11,508,434 B2
(45) Date of Patent: Nov. 22, 2022

(54) SEMICONDUCTOR MEMORY DEVICE AND METHOD FOR OPERATING THE SAME

(71) Applicant: SK hynix Inc., Icheon-si (KR)

(72) Inventor: Hyung Jin Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 23 days.

(21) Appl. No.: 16/984,743

(22) Filed: Aug. 4, 2020

(65) Prior Publication Data
US 2021/0280241 A1   Sep. 9, 2021

(30) Foreign Application Priority Data
Mar. 3, 2020   (KR) ........................ 10-2020-0026687

(51) Int. Cl.
| | |
|---|---|
| *G11C 11/56* | (2006.01) |
| *G11C 16/04* | (2006.01) |
| *G11C 16/34* | (2006.01) |
| *G11C 16/24* | (2006.01) |
| *G11C 16/26* | (2006.01) |
| *G11C 16/10* | (2006.01) |

(52) U.S. Cl.
CPC ...... *G11C 11/5628* (2013.01); *G11C 11/5642* (2013.01); *G11C 11/5671* (2013.01); *G11C 16/0483* (2013.01); *G11C 16/10* (2013.01); *G11C 16/24* (2013.01); *G11C 16/26* (2013.01); *G11C 16/349* (2013.01); *G11C 16/3459* (2013.01)

(58) Field of Classification Search
CPC .................................................. G11C 11/5628
See application file for complete search history.

(56) References Cited

U.S. PATENT DOCUMENTS

| | | | | |
|---|---|---|---|---|
| 2010/0061148 | A1* | 3/2010 | Komatsu ................ | G11C 16/24 365/185.03 |
| 2013/0088919 | A1* | 4/2013 | Kim ................... | G11C 16/3459 365/185.12 |
| 2013/0163331 | A1* | 6/2013 | Yoo ........................ | G11C 16/10 365/185.11 |
| 2016/0180956 | A1* | 6/2016 | Cho ....................... | G11C 16/34 365/185.21 |
| 2018/0277222 | A1* | 9/2018 | Kondo ............... | G11C 16/3481 |
| 2020/0202963 | A1* | 6/2020 | Ko ......................... | G11C 16/26 |

FOREIGN PATENT DOCUMENTS

| | | |
|---|---|---|
| KR | 1020120087537 A | 8/2012 |
| KR | 1020130072668 A | 7/2013 |

\* cited by examiner

*Primary Examiner* — Douglas King
(74) *Attorney, Agent, or Firm* — William Park & Associates Ltd.

(57) ABSTRACT

There are provided a semiconductor memory device and a method for operating the same. The semiconductor memory device includes: a memory cell array with a plurality of memory cells programmed to a plurality of program states; a peripheral circuit configured for performing a program operation on selected memory cells among the plurality of memory cells through a plurality of program loops; a current sensing circuit for determining a verify result of each of the plurality of program states by performing an individual state current sensing operation on the selected memory cells among the memory cells; and a control logic for controlling the current sensing circuit to perform the individual state current sensing operation, based on a number of program loops, among a plurality of program loops, that are performed.

21 Claims, 13 Drawing Sheets

SEMICONDUCTOR MEMORY DEVICE AND METHOD FOR OPERATING THE SAME

CROSS-REFERENCE TO RELATED APPLICATION

The present application claims priority under 35 U.S.C. § 119(a) to Korean patent application number 10-2020-0026687, filed on Mar. 3, 2020, in the Korean Intellectual Property Office, the entire disclosure of which is incorporated herein by reference.

BACKGROUND

1. Technical Field

The present disclosure generally relates to an electronic device, and more particularly, to a semiconductor memory device and a method for operating the same.

2. Related Art

The paradigm on recent computer environment has shifted to a ubiquitous computing environment in which computing systems can be used anywhere and anytime. This promotes the increased usage of portable electronic devices, such as mobile phones, digital cameras, so notebook computers, and the like. Such portable electronic devices may generally include a memory system using a semiconductor memory device, i.e., a data storage device. The data storage device is used as a main memory device or an auxiliary memory device of the portable electronic devices.

A data storage device that uses a semiconductor memory device has excellent stability and durability, high information access speed, and low power consumption, since there is no mechanical driving part. In an example of memory systems with such advantages, the data storage device includes a Universal Serial Bus (USB) memory device, memory cards with various interfaces, a Solid State Drive (SSD), and the like.

The semiconductor memory device is generally classified into a volatile memory device and a nonvolatile memory device.

The nonvolatile memory device has relatively slow write and read speeds, but retains stored data even when the supply of power is interrupted. Thus, the nonvolatile memory device is used to store data to be retained regardless of whether power is supplied.

Examples of the nonvolatile memory include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is classified into a NOR type flash memory and a NAND type flash memory.

SUMMARY

In accordance with an aspect of the present disclosure, there is provided a semiconductor memory device including: a memory cell array with a plurality of memory cells programmed to a plurality of program states; a peripheral circuit configured to perform a program operation on selected memory cells among the plurality of memory cells through a plurality of program loops; a current sensing circuit configured to determine a verify result of each of the plurality of program states by performing an individual state current sensing operation on the selected memory cells among the memory cells; and a control logic configured to control the current sensing circuit to perform the individual state current sensing operation, based on a number of program loops, among a plurality of program loops, that are performed.

In accordance with another aspect of the present disclosure, there is provided a semiconductor memory device including: a memory cell array with a plurality of memory cells programmed to first to nth program states, wherein n is a positive integer greater than 2; a peripheral circuit configured to perform a program operation on selected memory cells among the plurality of memory cells through a plurality of program loops; a current sensing circuit configured to perform individual state current sensing operations, respectively corresponding to the first to nth program states on the selected memory cells among the memory cells; and a control logic configured to control the peripheral circuit to perform the program operation, and control the current sensing circuit to skip the individual state current sensing operation that corresponds to the first program state during initial m program loops among the plurality of program loops, wherein m is a positive integer greater than 1.

In accordance with still another aspect of the present disclosure, there is provided a method for operating a semiconductor memory device, the method including: performing a first program operation that corresponds to a first program state among a plurality of program states; and performing a second program operation that corresponds to a second program state of threshold voltage distribution is higher than that of the first program state, after the first program operation is completed, wherein a plurality of first program loops are sequentially performed in the first program operation, wherein each of initial m (m is a positive integer greater than 1) program loops among the plurality of first program loops includes a program pulse application operation and a verify operation, and wherein each of (m+1)th to last program loops among the plurality of first program loops includes the program pulse application operation, the verify operation, and an individual state current sensing operation that corresponds to the first program state.

The method for operating a semiconductor memory device further comprising performing a third program operation that corresponds to a third program state of which threshold voltage distribution is higher than that of the second program state, after the second program operation is performed, wherein a plurality of third program loops are sequentially performed in the third program operation, wherein each of an initial k program loops among the plurality of third program loops includes the program pulse application operation and the verify operation, and wherein each of (k+1)th to last program loops among the plurality of third program loops may include the program pulse application operation, the verify operation, and an individual state current sensing operation that corresponds to the third program state.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Hereinafter, exemplary embodiments of the present disclosure will be described in detail with reference to the accompanying drawings in order for those skilled in the art to be able to readily implement the technical spirit of the present disclosure.

Embodiments provide a semiconductor memory device capable of reducing current consumption in a program operation, and a method for operating the semiconductor memory device.

Figure 1:
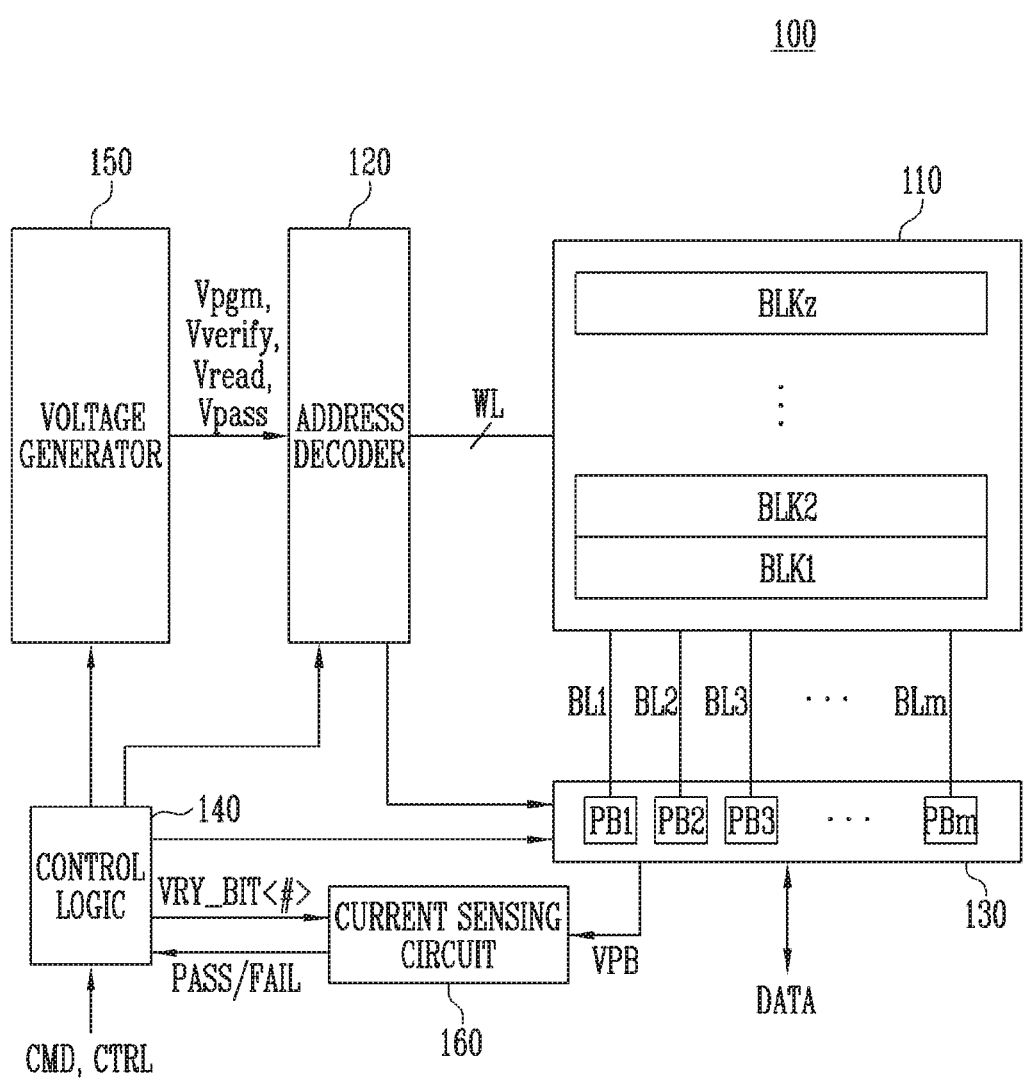
FIG. 1 is a block diagram, illustrating a semiconductor memory device, in accordance with an embodiment of the present disclosure.

FIG. 1 is a block diagram, illustrating a semiconductor memory device, in accordance with an embodiment of the present disclosure.

Referring to FIG. 1, the semiconductor memory device 100 may include a memory cell array 110, an address decoder 120, a read/write circuit 130, a control logic 140, a voltage generator 150, and a current sensing circuit 160.

The memory cell array 110 may include a plurality of memory blocks BLK1 to BLKz. The plurality of memory blocks BLK1 to BLKz may be connected to the address decoder 120 through word lines WL. The plurality of memory blocks BLK1 to BLKz may be connected to the read/write circuit 130 through bit lines BL1 to BLm. Each of the plurality of memory blocks BLK1 to BLKz may include a plurality of memory cells. In an embodiment, the plurality of memory cells may be nonvolatile memory cells and may be configured with nonvolatile memory cells with a vertical channel structure. The memory cell array 110 may be configured as a memory cell array with a two-dimensional structure. In some embodiments, the memory cell array 110 may be configured as a memory cell array with a three-dimensional structure. Meanwhile, each of the plurality of memory cells that are included in the memory cell array 110 may store at least 1-bit data. In an embodiment, each of plurality of the memory cells that is included in the memory cell array 110 may be a single-level cell (SLC) that stores a 1-bit data. In another embodiment, each of the plurality of memory cells that is included in the memory cell array 110 may be a multi-level cell (MLC) that stores a 2-bit data. In still another embodiment, each of the plurality of memory cells that is included in the memory cell array 110 may be a triple-level cell (TLC) that stores a 3-bit data. In still another embodiment, each of the plurality of memory cells that is included in the memory cell array 110 may be a quadruple-level cell (QLC) that stores a 4-bit data. In some embodiments, the memory cell array 110 may include a plurality of memory cells, each storing a 5-or-more bit data.

The address decoder 120 may be connected to the memory cell array 110 through the word lines WL. The address decoder 120 may operate under the control of the control logic 140. The address decoder 120 may receive an address through an input/output buffer (not shown) in the semiconductor memory device 100.

The address decoder 120 may decode a block address in the received address. The address decoder 120 may select at least one memory block based on the decoded block address. Also, in a program pulse application operation during a program operation, the address decoder 120 may apply a program voltage Vpgm that is generated by the voltage generator 150 to a selected word line of the selected memory block, and may apply a pass voltage Vpass that is generated by the voltage generator 150 to the other unselected word lines. Also, in a program verify operation, the address decoder 120 may apply a verify voltage Vverify that is generated by the voltage generator 150 to the selected word line of the selected memory block, and may apply the pass voltage Vpass to the other unselected word lines. Also, in a read voltage application operation during a read operation, the address decoder 120 may apply a read voltage Vread that is generated by the voltage generator 150 to the selected word line of the selected memory block and may apply the pass voltage Vpass to the other unselected word lines.

The address decoder 120 may decode a column address in the received address. The address decoder 120 may transmit the decoded column address to the read/write circuit 130.

Program and read operations of the semiconductor memory device 100 may be performed in a unit of a page. Addresses that are received in a request for the program and read operations may include a block address, a row address, and a column address. The address decoder 120 may select one memory block and one word line based on the block address and the row address. The column address may be decoded by the address decoder 120 to be provided to the read/write circuit 130. In this specification, memory cells that are connected to one word line may be designated as a "physical page."

The read/write circuit 130 may include a plurality of page buffers PB1 to PBm. The read/write circuit 130 may operate as a "read circuit" in a read operation and may operate as a "write circuit" in a write operation. The plurality of page buffers PB1 to PBm may be connected to the memory cell array 110 through the bit lines BL1 to BLm.

The plurality of page buffers PB1 to PBm may temporarily store data DATA to be programmed, which is received from an external device in a program operation, and controls a potential level of corresponding bit lines BL1 to BLm based on the temporarily stored data DATA.

The plurality of page buffers PB1 to PBm senses, through a sensing node, a change in amount of current flowing based on a program state of a corresponding memory cell by continuously supplying a sensing current to bit lines that are connected to memory cells so as to sense threshold voltages of the memory cells in a program verify operation, and latches the sensed change as sensing data.

The read/write circuit 130 may operate based on page buffer control signals output from the control logic 140.

The control logic 140 may be connected to the address decoder 120, the read/write circuit 130, the voltage generator 150, and the current sensing circuit 160. The control logic 140 may receive a command CMD and a control signal CTRL though the input/output buffer (not shown) of the semiconductor memory device 100. The control logic 140 may control a general operation of the semiconductor memory device 100 based on the control signal CTRL.

Meanwhile, the control logic 140 may determine whether a verify operation on a specific target program state or all target program states has passed or failed based on a pass signal PASS or a fail signal FAIL, which is received from the current sensing circuit 160.

The control logic 140 may control the read/write circuit 130 and the current sensing circuit 160 to skip an individual state current sensing operation while a set number of program loops are being performed in a program operation and to perform the individual state current sensing operation after the set number of program loops are performed. For example, in a program operation corresponding to first to nth program states, the control logic 140 may control the read/write circuit 130 and the current sensing circuit 160 to skip an individual state current sensing operation corresponding to the first program state during the initial m program loops. Also, the control logic 140 may control the read/write circuit 130 and the current sensing circuit 160 to skip an individual state current sensing operation during k program loops from after an individual state current sensing operation on a just previous program state is determined to be a pass in a program operation, corresponding to each of the second to nth program states. For example, the control logic 140 may control the read/write circuit 130 and the current sensing circuit 160 to skip an individual state current sensing operation on the second program state during k program loops after the individual state current sensing operation on the first program state is determined to be a pass and to skip an individual state current sensing operation on the third program state during k program loops after the individual state current sensing operation on the second program state is determined to be a pass.

The voltage generator 150 may generate the program voltage Vpgm and the pass voltage Vpass in the program pulse application operation during a program operation, based on a control signal output from the control logic 140, and may generate the verify voltage Vverify and the pass voltage Vpass in the program verify operation. Also, the voltage generator 150 may generate the read voltage Vread and the pass voltage Vpass in the read operation.

The sensing circuit 160 may generate a reference current based on an allow bit VRY_BIT<#> that is received from the control logic 140 in a current sensing operation and may output the pass signal PASS or the fail signal FAIL by comparing a sensing voltage VPB that is received from the page buffers PB1 to PBm that are included in the read/write circuit 130 with a reference voltage that is generated by the reference current.

More specifically, the current sensing circuit 160 may determine whether a verify operation, corresponding to a specific target program state being completed, or whether a verify operation, corresponding to all target program states being completed, by comparing a voltage that is generated based on a value of a bit line sense latch that is included in each of the page buffers PB1 to PBm with the reference voltage that is generated by the reference current in the current sensing operation. The bit line sense latch that is included in each of the page buffers PB1 to PBm will be described later with reference to FIG. 6.

The address decoder 120, the read/write circuit 130, and the voltage generator 150 may serve as a "peripheral circuit" which performs a read operation, a program operation, and an erase operation on the memory cell array 110. The peripheral circuit performs the read operation, the program operation, and the erase operation on the memory cell array 110 under the control of the control logic 140.

Figure 2:
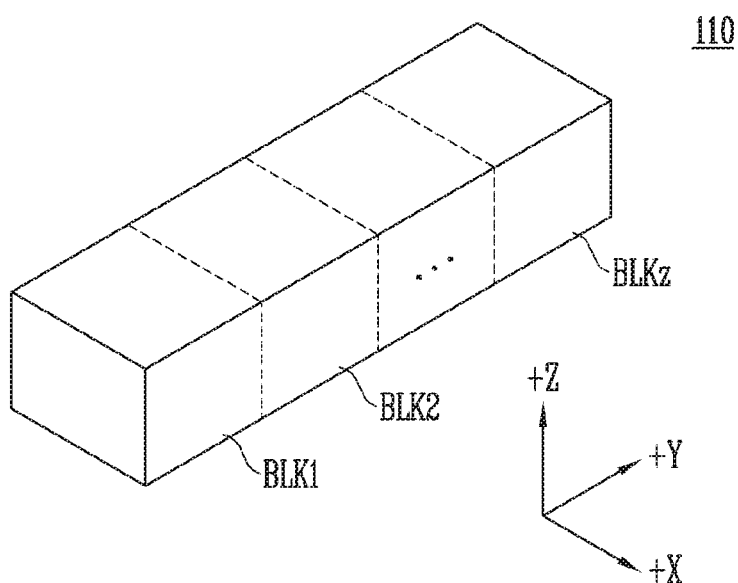
FIG. 2 is a diagram, illustrating an embodiment of a memory cell array that is shown in FIG. 1.

FIG. 2 is a diagram, illustrating an embodiment of the memory cell array that is shown in FIG. 1.

Referring to FIG. 2, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 3 and 4.

Figure 3:
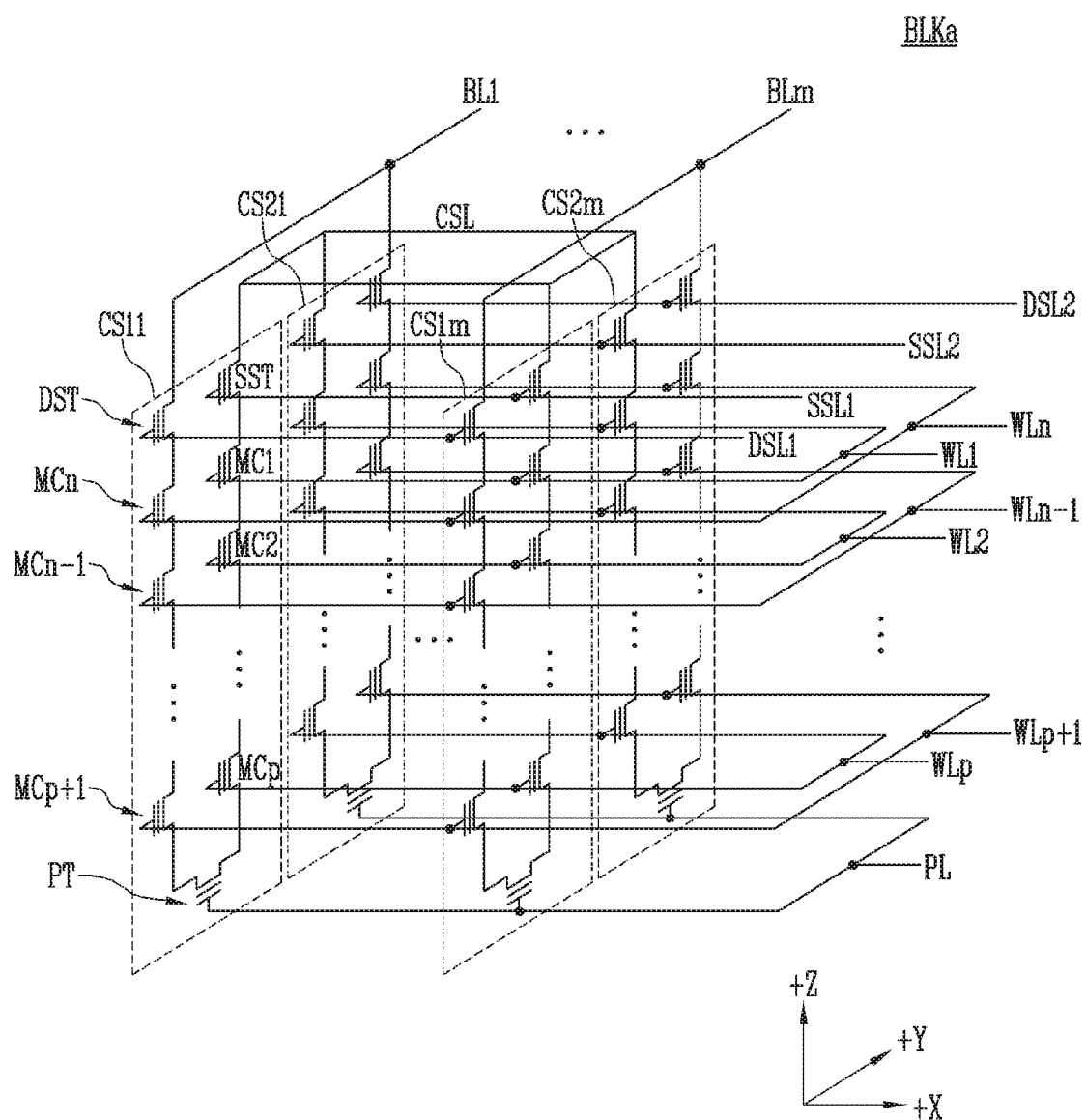
FIG. 3 is a circuit diagram, illustrating any one memory block among memory blocks that are shown in FIG. 2.

FIG. 3 is a circuit diagram, illustrating any one memory block BLKa among memory blocks BLK1 to BLKz that is shown in FIG. 2.

Referring to FIG. 3, the memory block BLKa may include a plurality of cell strings CS11 to CS1*m* and CS21 to CS2*m*. In an embodiment, each of the plurality of cell strings CS11 to CS1*m* and CS21 to CS2*m* may be formed in a 'U' shape. In the memory block BLKa, m cell strings may be arranged in a row direction (i.e., a +X direction). FIG. 3 illustrates two cell strings that are arranged in a column direction (i.e., a +Y direction). However, this is for convenience of description, and it will be understood that three cell strings may be arranged in the column direction.

Each of the plurality of cell strings CS11 to CS1*m* and CS21 to CS2*m* may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string may be connected between a common source line CSL and memory cells MC1 to MCp.

In an embodiment, the source select transistors of cell strings that are arranged on the same row may be connected to a source select line extending in the row direction, and the source select transistors of cell strings that are arranged on different rows may be connected to different source select lines. In FIG. 3, the source select transistors of the cell strings CS11 to CS1$m$ on a first row may be connected to a first source select line SSL1. The source select transistors of the cell strings CS21 to CS2$m$ on a second row may be connected to a second source select line SSL2.

In another embodiment, the source select transistors of the cell strings CS11 to CS1$m$ and CS21 to CS2$m$ may be commonly connected to one source select line.

The first to nth memory cells MC1 to MCn of each cell string may be connected between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp may be sequentially arranged in the opposite direction of a +Z direction and may be connected in series between the source select transistor SST and the pipe transistor PT. The (p+1)th to nth memory cells MCp+1 to MCn may be sequentially arranged in the +Z direction and may be connected in series between the pipe transistor PT and the drain select transistor DST. The first to pth memory cells MC1 to MCp and the (p+1)th to nth memory cells MCp+1 to MCn may be connected through the pipe transistor PT. Gate electrodes of the first to nth memory cells MC1 to MCn of each cell string may be connected to first to nth word lines WL1 to WLn, respectively.

A gate of the pipe transistor PT of each cell string may be connected to a pipe line PL.

The drain select transistor DST of each cell string may be connected between a corresponding bit line and the memory cells MCp+1 to MCn. Cell strings that are arranged in the row direction may be connected to a drain select line extending in the row direction. The drain select transistors of the cell strings CS11 to CS1$m$ on the first row may be connected to a first drain select line DSL1. The drain select transistors of the cell strings CS21 to CS2$m$ on the second row may be connected to a second drain select line DSL2.

Cell strings that are arranged in the column direction may be connected to a bit line extending in the column direction. In FIG. 3, the cell strings CS11 and CS21 on a first column may be connected to a first bit line BL1. The cell strings CS1$m$ and CS2$m$ on an mth column may be connected to an mth bit line BLm.

Memory cells that are connected to the same word line in the cell strings that are arranged in the row direction may constitute one page. For example, memory cells that are connected to the first word line WL1 in the cell strings CS11 to CS1$m$ on the first row may constitute one page. Memory cells that are connected to the first word line WL1 in the cell strings CS21 to CS2$m$ on the second row may constitute another page. As any one of the drain select lines DSL1 and DSL2 is selected, cell strings that are arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1$m$ or CS21 to CS2$m$ that are arranged in the row direction may be connected to the even bit lines, respectively, and odd-numbered cell strings among the cell strings CS11 to CS1$m$ or CS21 to CS2$m$ that are arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa may be improved. On the other hand, the size of the memory block BLKa may increase. When the number of dummy memory cells decreases, the size of the memory block BLKa may decrease. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells may control a voltage that is applied to the dummy word lines that are connected to the respective dummy memory cells, so that the dummy memory cells can have the required threshold voltage.

Figure 4:
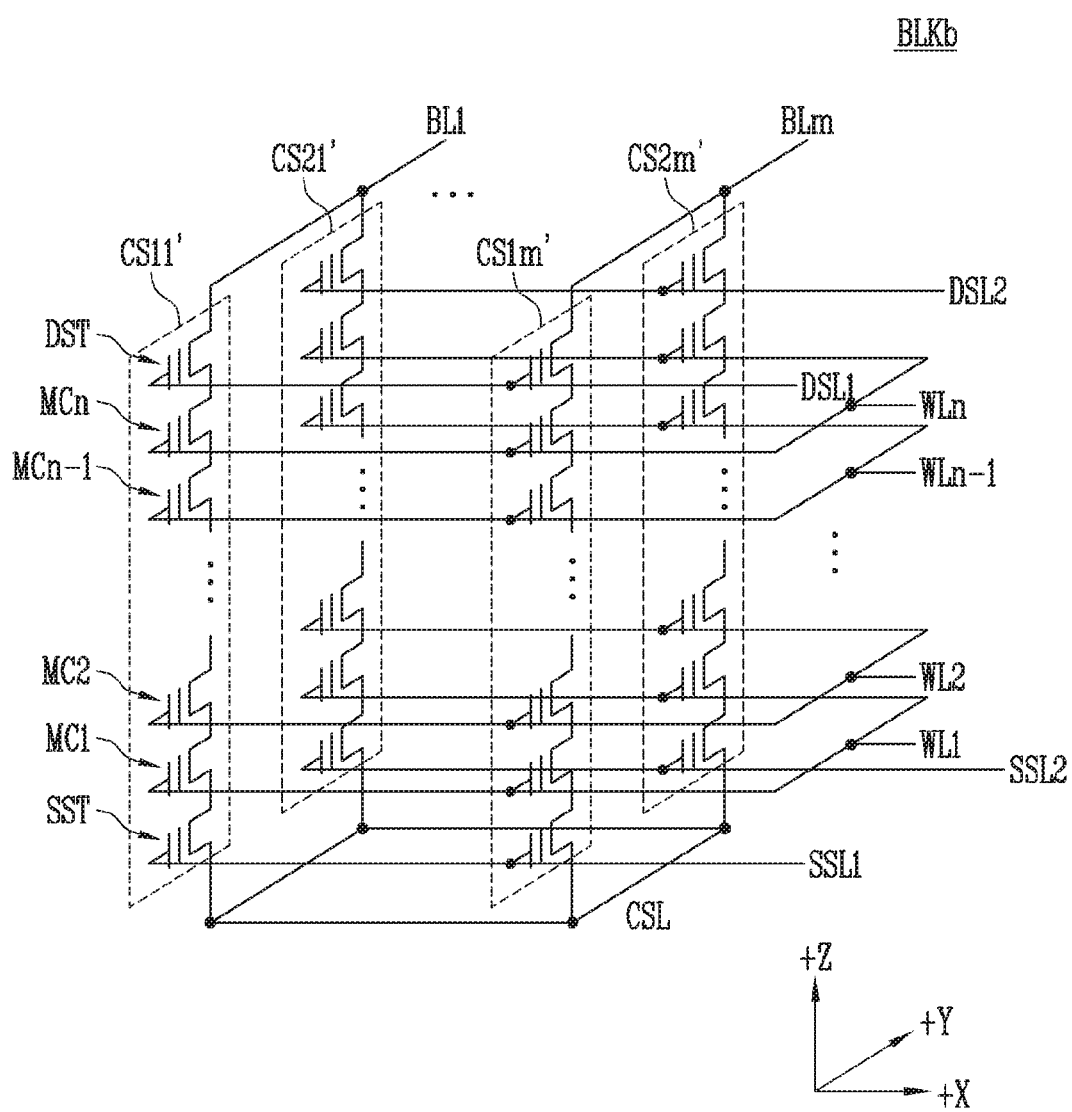
FIG. 4 is a circuit diagram, illustrating another embodiment of the one memory block among the memory blocks that are shown in FIG. 2.

FIG. 4 is a circuit diagram, illustrating another embodiment BLKb of the one memory block among the memory blocks BLK1 to BLKz that may be shown in FIG. 2.

Referring to FIG. 4, the memory block BLKb may include a plurality of cell strings CS11' to CS1$m$' and CS21' to CS2$m$'. Each of the plurality of cell strings CS11' to CS1$m$' and CS21' to CS2$m$' extends along the +Z direction. Each of the plurality of cell strings CS11' to CS1$m$' and CS21' to CS2$m$' may include at least one source select transistor SST, first to nth memory cells MC1 to MCn, and at least one drain select transistor DST, which may be stacked on a substrate (not shown) under the memory block BLKb.

The source select transistor SST of each cell string may be connected between a common source line CSL and the memory cells MC1 to MCn. The source select transistors of cell strings that are arranged on the same row may be connected to the same source select line. The source select transistors of the cell strings CS11' to CS1$m$' that are arranged on a first row may be connected to a first source select line SSL1. Source select transistors of the cell strings CS21' to CS2$m$' that are arranged on a second row may be connected to a second source select line SSL2. In another embodiment, the source select transistors of the cell strings CS11' to CS1$m$' and CS21' to CS2$m$' may be commonly connected to one source select line.

The first to nth memory cells MC1 to MCn of each cell string may be connected in series between the source select transistor SST and the drain select transistor DST. Gate electrodes of the first to nth memory cells MC1 to MCn may be connected to first to nth word lines WL1 to WLn, respectively.

The drain select transistor DST of each cell string may be connected between a corresponding bit line and the memory cells MC1 to MCn. The drain select transistors of cell strings that are arranged in the row direction may be connected to a drain select line extending in the row direction. The drain select transistors of the cell strings CS11' to CS1m' on the first row may be connected to a first drain select line DSL1. The drain select transistors of the cell strings CS21' to CS2m' on the second row may be connected to a second drain select line DSL2.

Consequently, the memory block BLKb of FIG. 4 has a circuit that is similar to that of the memory block BLKa of FIG. 3, except that the pipe transistor PT is excluded from each cell string in FIG. 4.

In another embodiment, even bit lines and odd bit lines may be provided instead of the first to mth bit lines BL1 to BLm. In addition, even-numbered cell strings among the cell strings CS11' to CS1m' or CS21' to CS2m' that are arranged in the row direction may be connected to the even bit lines, respectively, and odd-numbered cell strings among the cell strings CS11' to CS1m' or CS21' to CS2m' that are arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKb may be improved. On the other hand, the size of the memory block BLKb may be increased. When the number of dummy memory cells decreases, the size of the memory block BLKb may decrease. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines that are connected to the respective dummy memory cells, so that the dummy memory cells can have the required threshold voltage.

Figure 5:
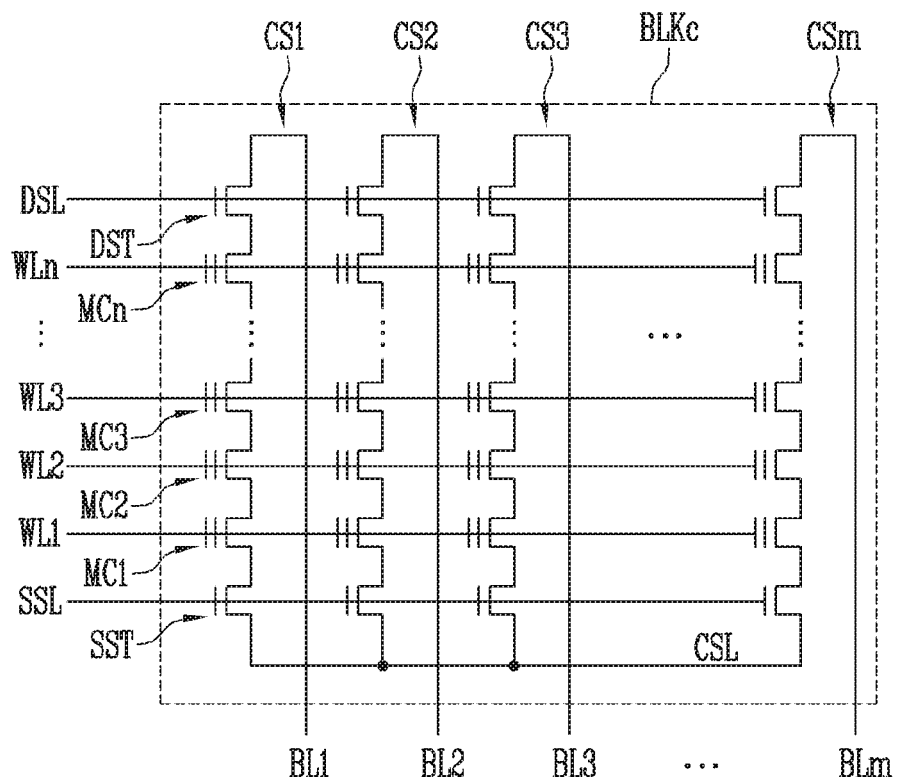
FIG. 5 is a circuit diagram, illustrating an embodiment of any one memory block among a plurality of memory blocks, included in the memory cell array that is shown in FIG. 1.

FIG. 5 is a circuit diagram, illustrating an embodiment of any one memory block BLKc among the plurality of memory blocks BLK1 to BLKz that are included in the memory cell array 110 that is shown in FIG. 1.

Referring to FIG. 5, the memory block BLKc may include a plurality of strings CS1 to CSm. The plurality of strings CS1 to CSm may be connected to a plurality of bit lines BL1 to BLm, respectively. Each of the plurality of strings CS1 to CSm may include at least one source select transistor SST, first to nth memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string may be connected between a common source line CSL and the memory cells MC1 to MCn.

The first to nth memory cells MC1 to MCn of each cell string may be connected between the source select transistor SST and the drain select transistor DST.

The drain select transistor DST of each cell string is connected between a corresponding bit line and the memory cells MC1 to MCn.

Memory cells that are connected to the same word line may constitute one page. As a drain select line DSL is selected, the cell strings CS1 to CSm may be selected. As any one of word lines WL1 to WLn is selected, one page among selected cell strings may be selected.

In another embodiment, even bit lines and odd bit lines may be provided instead of the first to mth bit lines BL1 to BLm. Even-numbered cell strings among the cell strings CS1 to CSm arranged may be connected to the even bit lines, respectively, and odd-numbered cell strings among the cell strings CS1 to CSm may be connected to the odd bit lines, respectively.

As described above, memory cells that are connected to one word line may constitute one physical page. In the example shown in FIG. 5, among the memory cells belonging to the memory block BLKc, m memory cells that are connected to any one word line among the plurality of word lines WL1 to WLn may constitute one physical page.

As shown in FIGS. 2 to 4, the memory cell array 110 of the semiconductor memory device 100 may be configured in a three-dimensional structure, but may also be configured in a two-dimensional structure as shown in FIG. 5.

Figure 6:
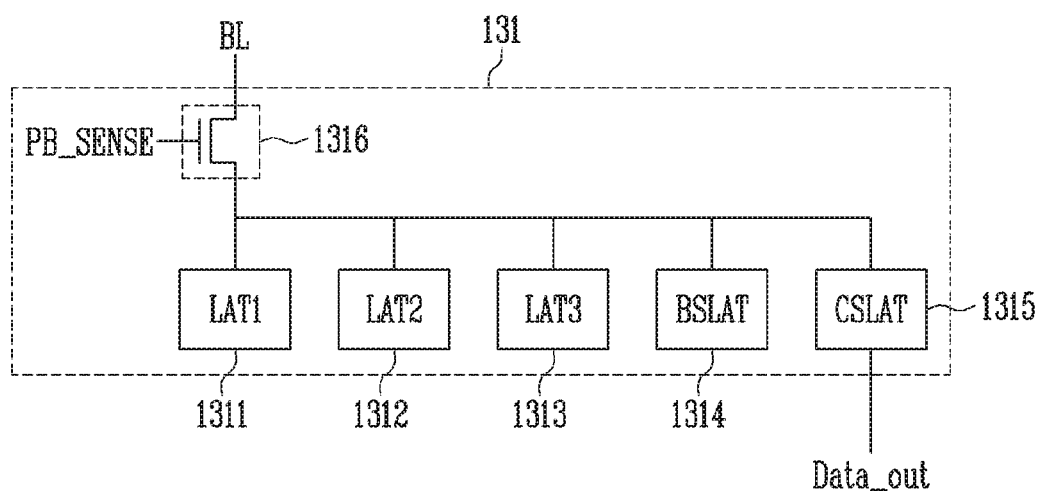
FIG. 6 is a diagram, schematically illustrating a page buffer, in accordance with an exemplary embodiment of the present disclosure.

FIG. 6 is a diagram, schematically illustrating a page buffer 131, in accordance with an exemplary embodiment of the present disclosure.

In a program verify operation, data that is stored in a memory cell or a threshold voltage of the memory cell may be sensed through a bit line BL. The page buffer 131 may include a bit line sense latch BSLAT 1314 for storing such a sensing result. Also, the bit line sense latch 1314 may be used to determine a program allow voltage or a program inhibit voltage, which is applied to the bit line BL, in a program pulse application operation.

The page buffer 131 may include a plurality of data latches 1311, 1312, and 1313 for storing program data input from an external device in a program operation. For example, in the embodiment shown in FIG. 6, the page buffer 131 may store 3-bit data. A data latch LAT1 1311 may store a most significant bit (MSB), a data latch LAT2 1312 may store a central significant bit (CSB), and a data latch LATS 1313 may store a least significant bit (LSB). The data latches 1311, 1312, and 1313 may maintain the stored program data, until the memory cell is completely programmed.

In addition, a cache latch CSLAT 1315 may receive data read from the memory cell in a read operation from the bit line sense latch 1314 and output the received data to an external device of the page buffer 131 through a data output line Data-out.

Meanwhile, the page buffer 131 may include a bit line connection transistor 1316 that controls the connection of the bit line BL to the bit line sense latch 1314, the data latches 1311, 1312, and 1313 and the cache latch 1315. The bit line connection transistor 1316 may be controlled by a bit line connection signal PB_SENSE. For example, when data is read from the memory cell, the bit line connection transistor 1316 may be turned on to electrically connect the bit line BL and the bit line sense latch 1314. Also, the bit line connection transistor 1316 may be turned off when data that is stored in the bit line sense latch 1314 is transmitted to the cache latch 1315.

In the program verify operation during the program operation of the memory cell, a value that represents whether a threshold voltage of the memory cell that is connected to the corresponding bit line BL may be greater than a verify voltage corresponding to a target state may be stored in the bit line sense latch 1314. For example, when the threshold voltage of the memory cell connected to bit line BL is smaller than the verify voltage corresponding to the target state, a value of "0" may be stored in the bit line sense latch 1314. While the value of "0" is being stored in the bit line sense latch 1314, a program allow voltage may be applied to the bit line BL when a program pulse is applied. Meanwhile, while the program operation is being performed, a value of "1" may be stored in the bit line sense latch 1314 when the threshold voltage of the memory cell connected to the bit line BL is greater than the verify voltage corresponding to the target state. When the value of "1" is stored in the bit line sense latch 1314, the value of the bit line sense latch 1314 may be maintained as "1" in a next program loop, and a program inhibit voltage may be applied to the bit line when a program pulse is applied. Meanwhile, since it is unnecessary to increase a threshold voltage in the case of a memory cell corresponding to an erase state E, the bit line sense latch 1314 of the page buffer 131, which may be connected to memory cells corresponding to the erase state E, may have the value of "1" from a program early stage.

Thus, whether the memory cell that is connected to the bit line BL of the page buffer 131 has been programmed to a target program state may be determined based on the value of the bit line sense latch 1314. The current sensing circuit 160 may perform a current sensing operation, based on the value stored in the bit line sense latch 1314 of the page buffer 131. Accordingly, the current sensing circuit 160 may determine whether a verify operation, corresponding to the specific target program state, has been completed or whether a verify operation, corresponding all target program states, has been completed.

Figure 7:
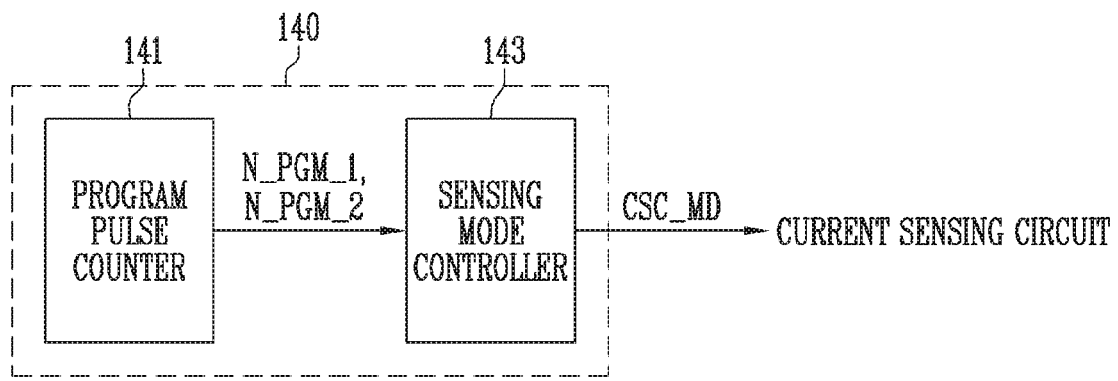
FIG. 7 is a block diagram, illustrating a control logic, in accordance with an embodiment of the present disclosure.

FIG. 7 is a block diagram, illustrating a control logic 140, in accordance with an embodiment of the present disclosure.

Referring to FIG. 7, the control logic 140 may include a program pulse counter 141 and a sensing mode controller 142. The program pulse counter 141 may update a first program pulse count value N_PGM_1 by counting a number of program pulses that are applied to a selected word line during a program operation. Accordingly, a number of program loops performed currently may be determined.

The program pulse counter 141 may update a second program pulse count value N_PGM_2 by counting a number of program pulses that is applied to the selected word line after the result of an individual state current sensing operation is determined as a pass.

That is, the program pulse counter 141 may count and update the first program pulse count value N_PGM_1 whenever a program loop is performed during the program operation and may update the second program pulse count value N_PGM_2 by counting the number of program pulses that are applied to the selected word line after the result of an individual state current sensing operation, corresponding to a first program state that is determined to be a pass. In addition, the program pulse counter 141 may update the second program pulse count value N_PGM_2 by newly counting a number of program pulses that are applied to the selected word line after the result of an individual state current sensing operation, corresponding to a second program state that is determined to be a pass, and may update the second program pulse count value N_PGM_2 by newly counting a number of program pulses that are applied to the selected word line after the result of an individual state current sensing operation, corresponding to a third program state that is determined to be a pass. That is, the program pulse counter 141 may update the second program pulse count value N_PGM_2 by newly counting the number of program pulses that are applied to the selected word line after the result of an individual state current sensing operation, corresponding to each of first to (n−1)th program states. Accordingly, the number of program loops that are performed after the result of each individual state current sensing operation is determined as a pass may be determined.

The program pulse counter 141 may transfer the first program pulse count value N_PGM_1 and the second program pulse count value N_PGM_2 to the sensing mode controller 143. The sensing mode controller 143 may generate a current sensing mode signal CSC_MD based on the received first program pulse count value N_PGM_1 or the received second program pulse count value N_PGM_2. More specifically, the sensing mode controller 143 may generate the current sensing mode control signal CSC_MD by comparing the received first program pulse count value N_PGM_1 with a predetermined first threshold value. Also, the sensing mode controller 143 may generate the current sensing mode control signal CSC_MD by comparing the received second program pulse count value N_PGM_2 with a predetermined second threshold value. To this end, the sensing mode controller 143 may include a storage, such as a register which stores the first threshold value and the second threshold value.

For example, when the first program pulse count value N_PGM_1 is smaller than the first threshold value, the sensing mode controller 143 may generate the current sensing mode signal CSC_MD which allows the individual state current sensing operation corresponding to the first program state to be skipped, and transfer the current sensing mode signal CSC_MD to the current sensing circuit 160. Also, when the first program pulse count value N_PGM_1 is equal to or greater than the first threshold value, the sensing mode controller 143 may generate the current sensing mode signal CSC_MD which allows the individual state current sensing operation corresponding to the first program state to be performed, and transfer the current sensing mode signal CSC_MD to the current sensing circuit 160.

When the second program pulse count value N_PGM_2 is smaller than the second threshold value, the sensing mode controller 143 may generate the current sensing mode signal CSC_MD which allows the individual state current sensing operation corresponding to any one of the second to nth program states to be skipped, and transfer the current sensing mode signal CSC_MD to the current sensing circuit 160. Also, when the second program pulse count value N_PGM_2 is equal to or greater than the second threshold value, the sensing mode controller 143 may generate the current sensing mode signal CSC_MD, which allows the individual state current sensing operation corresponding to any one of the second to nth program states to be performed, and may transfer the current sensing mode signal CSC_MD to the current sensing circuit 160.

The current sensing mode signal CSC_MD may be transferred to the current sensing circuit 160 as shown in FIG. 1. The current sensing circuit 160 may perform an individual state current sensing operation based on the current sensing mode signal CSC_MD.

Figure 8:
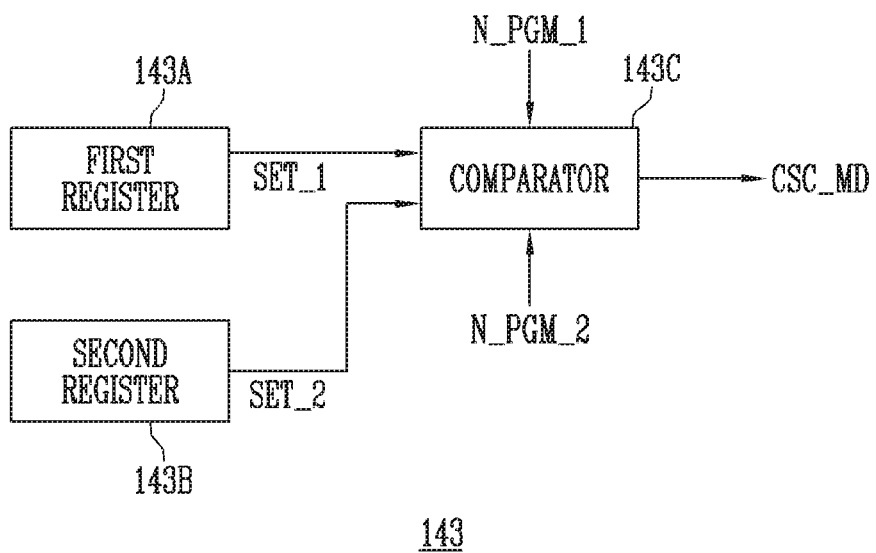
FIG. 8 is a block diagram, illustrating a sensing mode controller that is shown in FIG. 7.

FIG. 8 is a block diagram, illustrating the sensing mode controller 143 that is shown in FIG. 7.

Referring to FIG. 8, the sensing mode controller 143 may include a first register 143A, a second register 143B, and a comparator 143C.

The first register 143A may store a first threshold value SET1, and output the first threshold value SET1 stored in a verify operation during a program operation on the first program state to the comparator 143C.

The second register 143B may store a second threshold value SET2, and output the second threshold value SET2 stored in a verify operation during a program operation on the second to nth program states to the comparator 143C.

The comparator 143C may generate and output a current sensing mode signal CSC_MD based on the first program pulse count value N_PGM_1 or the second program pulse count value N_PGM_2, which is received from the program pulse counter (141 shown in FIG. 7).

More specifically, the comparator 143C may generate and output the current sensing mode signal CSC_MD by comparing the first program pulse count value N_PGM_1 and the first threshold value SET1 in the program operation on the first program state. For example, when the first program pulse count value N_PGM_1 is smaller than the first threshold value SET1, the comparator 143C may generate and output the current sensing mode signal CSC_MD, which allows an individual state current sensing operation corresponding to the first program state to be skipped.

Also, the comparator 143C may generate and output the current sensing mode signal CSC_MD by comparing the second program pulse count value N_PGM_2 and the second threshold value SET2 in the program operation on the second to nth program states. For example, when the second program pulse count value N_PGM_2 is smaller than the second threshold value SET2, the comparator 143C may generate and output the current sensing mode signal CSC_MD which allows an individual state current sensing operation corresponding to each of the second to nth program states to be skipped.

Figure 9:
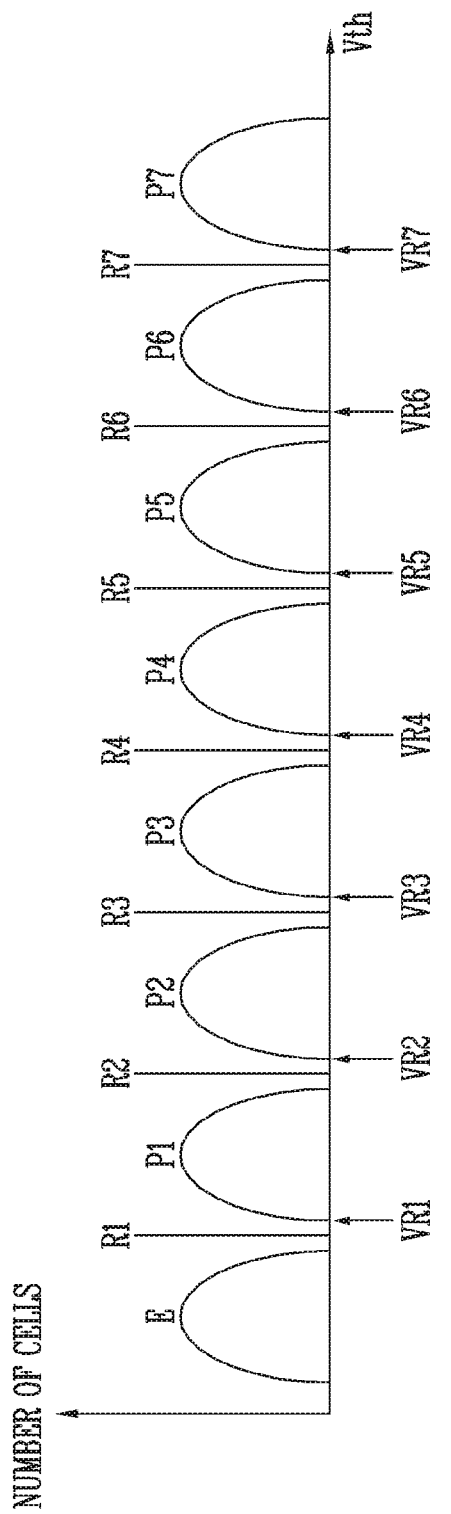
FIG. 9 is a graph, illustrating program states of a triple level cell.

FIG. 9 is a graph, illustrating program states of a triple level cell.

Referring to FIG. 9, a triple level cell (TLC) has threshold voltage states respectively corresponding to one erase state E and seven program states P1 to P7. The erase state E and first to seventh program states P1 to P7 may have a corresponding bit code. If necessary, various bit codes may be provided to the erase state E and the first to seventh program states P1 to P7.

The threshold voltage states may be distinguished based on first to seventh read voltages R1 to R7. In addition, the first to seventh verify voltages VR1 to VR7 may be used to determine whether memory cells, corresponding to each program state, have been completely programmed.

For example, a second verify voltage VR2 may be applied to a word line so as to verify memory cells corresponding to the second program state among memory cells that are included in a selected physical page. A memory cell that corresponds to the second program state P2 may be distinguished by the data latches 1311, 1312, and 1313 shown in FIG. 6. For example, when a bit code that corresponds to the second program state is "101," a memory cell that is connected to the page buffer in which values of "1," "0," and "1" may be respectively stored in the data latches 1311, 1312, and 1313 may be a memory cell to be programmed to the second program state P2. Among memory cells to be programmed to the second program state P2, a memory cell in which the value of the bit line sense latch 1314 is "0" may be a memory cell which has not been yet programmed to the second program state P2, and a memory cell in which the value of the bit line sense latch 1314 is "1" may be a memory cell which has been completely programmed to the second program state P2.

By applying the second verify voltage VR2 to the word line and performing bit line BL sensing, the value of the bit line sense latch 1314 may maintain "0" when the threshold value of a memory cell is smaller than the second verify voltage VR2. Meanwhile, the value of the bit line sense latch 1314 may become "1" when the threshold value of the memory cell is greater than the second verify voltage VR2. When the value of the bit line sense latch 1314 becomes "1," a program inhibit voltage may be applied to the bit line BL connected to the corresponding memory cell in a next program loop. Therefore, the threshold voltage of the corresponding memory cell might not increase any more even when a program pulse is applied to the word line.

An operation of changing the value of the bit line sense latch 1314, which corresponds to the second verify voltage VR2, as described above may be individually performed on the memory cells to be programmed to the second program state P2. Whether the memory cells to be programmed to the second program state P2 have been completely programmed, i.e., determination of verify pass/fail may be performed by the current sensing circuit 160 as shown in FIG. 1.

In the example shown in FIG. 1, the current sensing circuit 160 may determine the verify pass or verify fail by comparing a reference voltage based on a reference current corresponding to a number of memory cells to be programmed to the second program state P2 with a sensing voltage VPB based on a sensing current corresponding to a number of memory cells with threshold voltages greater than the verify voltage VR2 among the memory cells to be programmed to the second program state P2. That is, the current sensing circuit 160 may determine the verify pass or verify fail with respect to the second program state P2 by comparing the sensing voltage VPB that is determined based on the number of memory cells in which the value stored in the bit line sense latch BSLAT is "1" among the memory cells to be programmed to the second program state P2 with the reference value.

As described above, the current sensing circuit 160 may perform determination of verify pass/fail with respect to a specific program state (e.g., P2). Hereinafter, throughout this specification, an operation of determining verify pass/fail with respect to a specific program state among a plurality of program states will be designated as an "individual state current sensing operation." In the individual state current sensing operation, it may be determined whether memory cells to be programmed to a specific program state have been completely programmed.

On the other hand, an operation of determining verify pass/fail with respect to whole of the program states P1 to P7 will be designated as a "whole state current sensing operation." In the whole state current sensing operation, it may be determined whether the whole program operation has been completed, by comparing a reference voltage corresponding to a total number of memory cells that are included in the selected physical page with a sensing voltage corresponding to a number of memory cells which have been completely programmed (including a memory cell corresponding to the erase state) among the memory cells that are included in the selected physical page. That is, in the whole state current sensing operation, the verify pass or verify fail, with respect to the second target program state P2, may be determined by comparing the sensing voltage VPB determined based on a number of memory cells in which the value that is stored in the bit line sense latch BSLAT is "1" among whole of the memory cells that are included in the selected physical page with the reference voltage.

Although target program states of the triple level cell may be illustrated in FIG. 9, this is merely illustrative, and each of the plurality of memory cells that is included in the semiconductor memory device may be a multi-level cell (MLC). In another embodiment, each of the plurality of memory cells that is included in the semiconductor memory device may be a quadruple-level cell (QLC).

Figure 10:
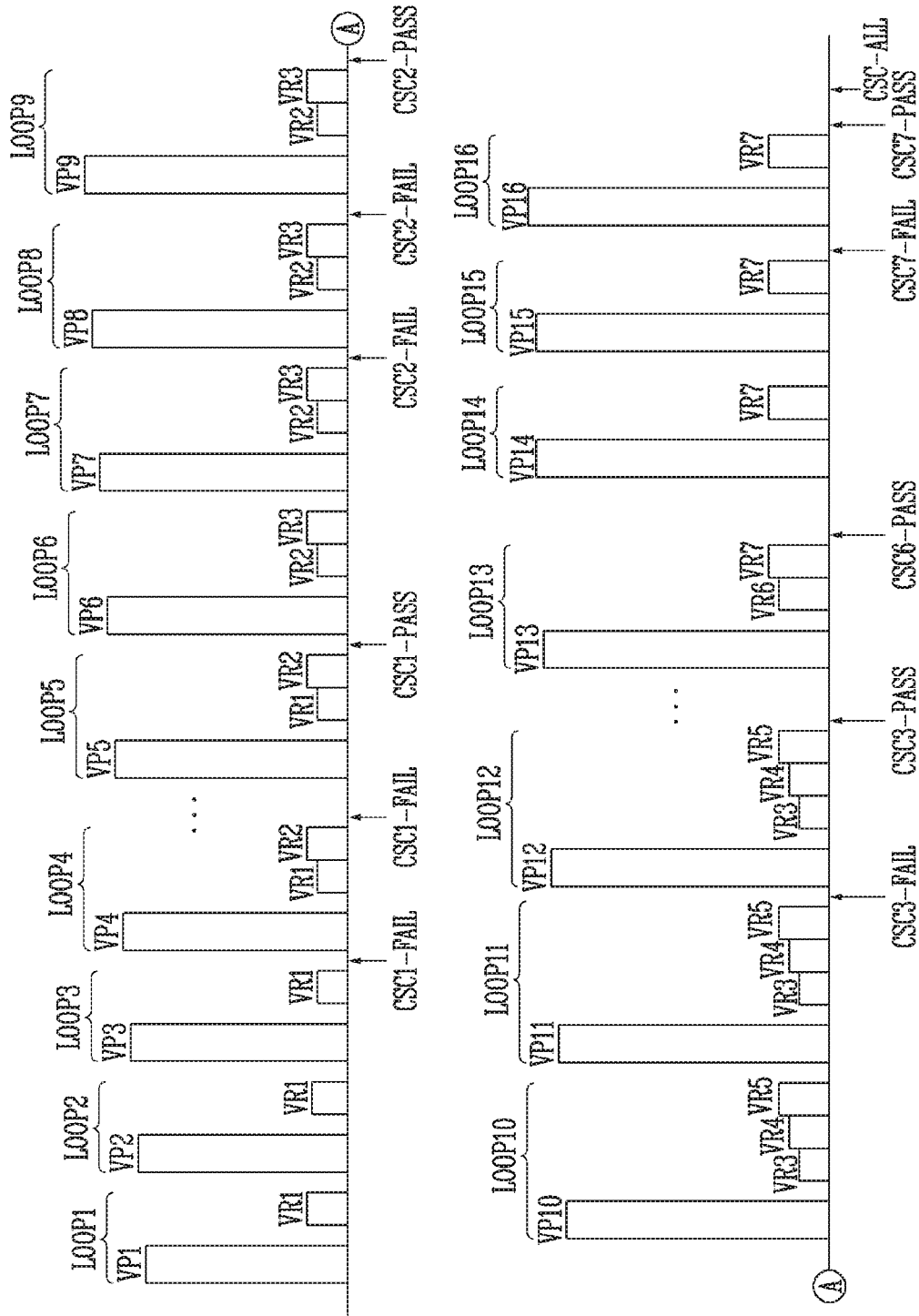
FIG. 10 is a diagram, illustrating a program operation, based on an individual state current sensing operation, in accordance with an embodiment of the present disclosure.

FIG. 10 is a diagram, illustrating a program operation, based on an individual state current sensing operation, in accordance with an embodiment of the present disclosure.

Referring to FIGS. 9 and 10, an embodiment in which a program operation is performed on the first to seventh program states P1 to P7 is illustrated. In the program operation, a plurality of program loops LOOP1 to LOOP16, corresponding to the first to seventh program states P1 to P7, may be sequentially performed. For example, program loops LOOP1 to LOOP5 may correspond to the first program state P1, and program loops LOOP6 to LOOP9 may correspond to the second program state P2. In addition, program loops LOOP10 to LOOP12 may correspond to the third state P3, a program loop LOOP13 may correspond to the sixth program state P6, and program loops LOOP14 to LOOP16 may correspond to the seventh program state P7. Although program loops that correspond to the fourth and fifth program states P4 and P5 are not illustrated in FIG. 10, some program loop are not illustrated for convenience of description, and the program loops that correspond to the fourth and fifth program states P4 and P5 may be substantially disposed and performed between the program loop LOOP12 and the program loop LOOP13.

Each of the program loops LOOP1 to LOOP16 may include a program pulse application operation and at least one verify operation, and individual state current sensing operations of some program loops (e.g., LOOP1 and LOOP2, LOOP6, LOOP10, and LOOP14) may be skipped. This will be described in more detail as follows.

An individual state current sensing operation may be skipped during the initial m (m is a positive integer greater than 1) program loops in a program operation on the first program state P1 of which the threshold voltage distribution is lowest among the plurality of program states P1 to P7. For example, in the embodiment of the present disclosure, an individual state current sensing operation may be skipped in each of two program loops LOOP1 and LOOP2, which may be initially performed. An application operation of a first program puke VP1 and a verify operation using a verify voltage VR1 that corresponds to the first program state may be performed in the program loop LOOP1, and an application operation of a second program pulse VP2 and a verify operation using the verify voltage VR1 may be performed in the program loop LOOP2. In each of the program loops LOOP3 to LOOP5, a program pulse application operation, a verify operation, and an individual state current sensing operation corresponding to the first program state P1 may be performed. In the program loop LOOP3, an application operation of a third program pulse VP3, a verify operation using the verify voltage VR1 corresponding to the first program state, and an individual state current sensing operation corresponding to the first program state P1 may be performed. When the individual state current sensing operation corresponding to the first program state P1 is determined to be a fail CSC-FAIL, an application operation of a fourth program pulse VP4, a verify operation using the verify voltage VR1 and a verify voltage VR2 corresponding to the second program state P2, and an individual state current sensing operation corresponding to the first program state P1 may be performed in the next program loop LOOP4. When the individual state current sensing operation that corresponds to the first program state P1 is determined to be a fail CSC1-FAIL, an application operation of a fifth program pulse VP5, a verify operation using the verify voltage VR1 and the verify voltage VR2, and an individual state current sensing operation corresponding to the first program state P1 may be performed in the next program loop LOOP5. When the individual state current sensing operation that corresponds to the first program state P1 is determined to be a pass CSC1-PASS, it may be determined that a program operation that corresponds to memory cells to be programmed to the first program state P1, and program loops LOOP6 to LOOP9 with respect to a next program state (e.g., the second program state P2) may be performed.

An individual state current sensing operation may be skipped during the initial k (k is a positive integer greater than 1) after a program loop, corresponding to a program state in which the previous program operation has been completed during a program operation in the other program states P2 to P7, except the first program state P1 of which the threshold voltage distribution is lowest among the plurality of program states P1 to P7. For example, an individual state current sensing operation may be skipped in one program loop after the program the program loop, corresponding to the program state in which the previous program operation has been completed during the program operation in the other program states P2 to P7, is performed.

For example, an individual state current sensing operation, corresponding to the second program state, might not be performed in one program loop LOOP6 after the program loop LOOP5 in which the individual state current sensing operation, corresponding to the first program state P1, is determined to be a pass CSC1-PASS among the plurality of program loops LOOP6 to LOOP9, corresponding to the second program state, is performed, and an individual state current sensing operation, corresponding to the second program state, is performed in the other program loops LOOP7 to LOOP9. An application operation of a sixth program pulse VP6 and a verify operation using the second verify voltage VR2 and the third program state may be performed on the program loop LOOP6. Subsequently, a program pulse application operation, a verify operation, and an individual state current sensing operation corresponding to the second program state P2 may be performed in each of the program loops LOOP7 to LOOP9. An application operation of a seventh program pulse VP7, a verify operation using the verify voltage VR2 and the verify voltage VR3, and an individual state current sensing operation corresponding to the second program state P2 may be performed in the program loop LOOP7. When the individual state current sensing operation, corresponding to the second program state P2, is determined to be a fail CSC2-FAIL, an application operation of an eighth program pulse VP8, a verify operation using the verify voltage VR2 and the verify voltage VR3, and an individual state current sensing operation, corresponding to the second program state P2, may be performed in a next program LOOP8. When the individual state current sensing operation, corresponding to the second program state P2, is determined to be a fail CSC2-FAIL, an application operation of a ninth program pulse VP9, a verify operation using the verify voltage VR2 and the verify voltage VR3, and an individual state current sensing operation corresponding to the second program state P2 may be performed in a next program loop LOOP9. When the individual state current sensing operation, corresponding to the second program state P2, is determined to be a pass CSC2-PASS, it is determined that a program operation, corresponding to the memory cells to be programmed to the second program state P2, has been completed, and program loops LOOP10 to LOOP12 with respect to a next program state (e.g, the third program state P3) may be performed.

For example, an individual state current sensing operation might not be performed in one program loop LOOP10 after the program loop LOOP9 in which the individual state current sensing operation, corresponding to the second program state P2, is determined to be a pass CSC2-PASS among the plurality of program loops LOOP10 to LOOP12, corresponding to the third program state, is performed, and an individual state current sensing operation, corresponding to the third program state, is performed in the other program loops LOOP11 and LOOP12. An application operation of a tenth program pulse VP10 and a verify operation using the verify voltage VR3, a verify voltage VR4 that corresponds to the fourth program state, and a verify voltage VR5 that corresponds to the fifth program state may be performed in the program loop LOOP10. Subsequently, an application operation of a program pulse, a verify operation, and an individual state current sensing operation corresponding to the third program state P3 may be performed in each of the program loops LOOP11 and LOOP12. An application operation of an eleventh program pulse VP11, a verify operation using the verify voltage VR3, the verify voltage VR4, and the verify voltage VR5, and an individual state current sensing operation corresponding to the third program state P3 may be performed in the program loop LOOP11. When the individual state current sensing operation that corresponds to the third program state P3 is determined to be a fail CSC3-FAIL, an application operation of a twelfth program pulse VP12, a verify operation using the verify voltage VR3, the verify voltage VR4, and the verify voltage VR5, and an individual state current sensing operation corresponding to the third program state P3 may be performed in a next program loop LOOP12. When the individual state current sensing operation corresponding to the third program state P3 is determined to be a pass CSC3-PASS, it may be determined that a program operation that corresponds to the memory cells to be programmed to the third program state P3 has been completed, and program loops with respect to a next program state (e.g., the fourth program state P4) may be performed.

An application operation of a sixteenth program pulse V16, a verify operation using a verify voltage VR6 that corresponds to the sixth program state P6, a verify voltage VR7 that corresponds to the seventh program state P7, and an individual state current sensing operation that corresponds to the sixth program state P6 may be performed in the program loop 13 that corresponds to the sixth program state P6. When the individual state current sensing operation that corresponds to the sixth program state P6 is determined to be a pass CSC6-PASS, it may be determined that a program operation that corresponds to the memory cells to be performed to the sixth program state P6 has been completed, and program loops with respect to a next program state (e.g., the seventh program state P7) may be performed.

For example, an individual state current sensing operation that corresponds to the seventh program state might not be performed in one program loop LOOP14 after the program loop LOOP13 in which the individual state current sensing operation that corresponds to the sixth program state P6 is determined to be a pass CSCE-PASS among the plurality of program loops LOOP14 to LOOP16, corresponding to the seventh program state, is performed, and an individual state current sensing operation that corresponds to the seventh program state is performed in the other program loops LOOP15 and LOOP16. An application operation of a fourteenth program pulse VP14 and a verify operation that uses a verify voltage that corresponds to the seventh program state P7 may be performed in the program loop LOOP14. Subsequently, a program pulse application operation, a verify operation, and an individual state current sensing operation, corresponding to the seventh program state P7, may be performed in each of the program loops LOOP15 and LOOP16. An application operation of a fifteenth program pulse VP15, a verify operation using the verify voltage VR7, and an individual state current sensing operation, corresponding to the seventh program state P7, may be performed in the program loop LOOP15. When the individual state current sensing operation that corresponds to the seventh program state P7 is determined to be a fail CSC7-FAIL, an application operation of a sixteenth program pulse VP16, a verify operation using the verify voltage VR7, and an individual state current sensing operation that corresponds to the seventh program state P7 may be performed in the next program loop LOOP16. When the individual state current sensing operation that corresponds to the seventh program state P7 is determined to be a pass CSC7-PASS, it may be determined that a program operation that corresponds to the memory cells to be programmed to the seventh program state P7 has been completed.

When it is determined that a program operation on the seventh program state P7 has been completed, a whole state current sensing operation CSC-ALL that determines whether a program operation on all the program states P1 to P7 has been completed may be performed.

When the whole state current sensing operation CSC-ALL is determined to be a fail, the whole state current sensing operation CSC-ALL may be re-performed after an additional program pulse application operation is performed.

A program operation on each of a plurality of program states may be completed when at least one program loop is to be performed in each of the program states. Therefore, it is highly likely that a fail will occur when an individual state current sensing operation is performed in the initial program loops among a plurality of program loops corresponding to each program state. Accordingly, in the embodiment of the present disclosure, an individual state current sensing operation is skipped in the initial program loops among a plurality of program loops that correspond to each program state, so that current consumption due to the individual state current sensing operation may be reduced.

Figure 11:
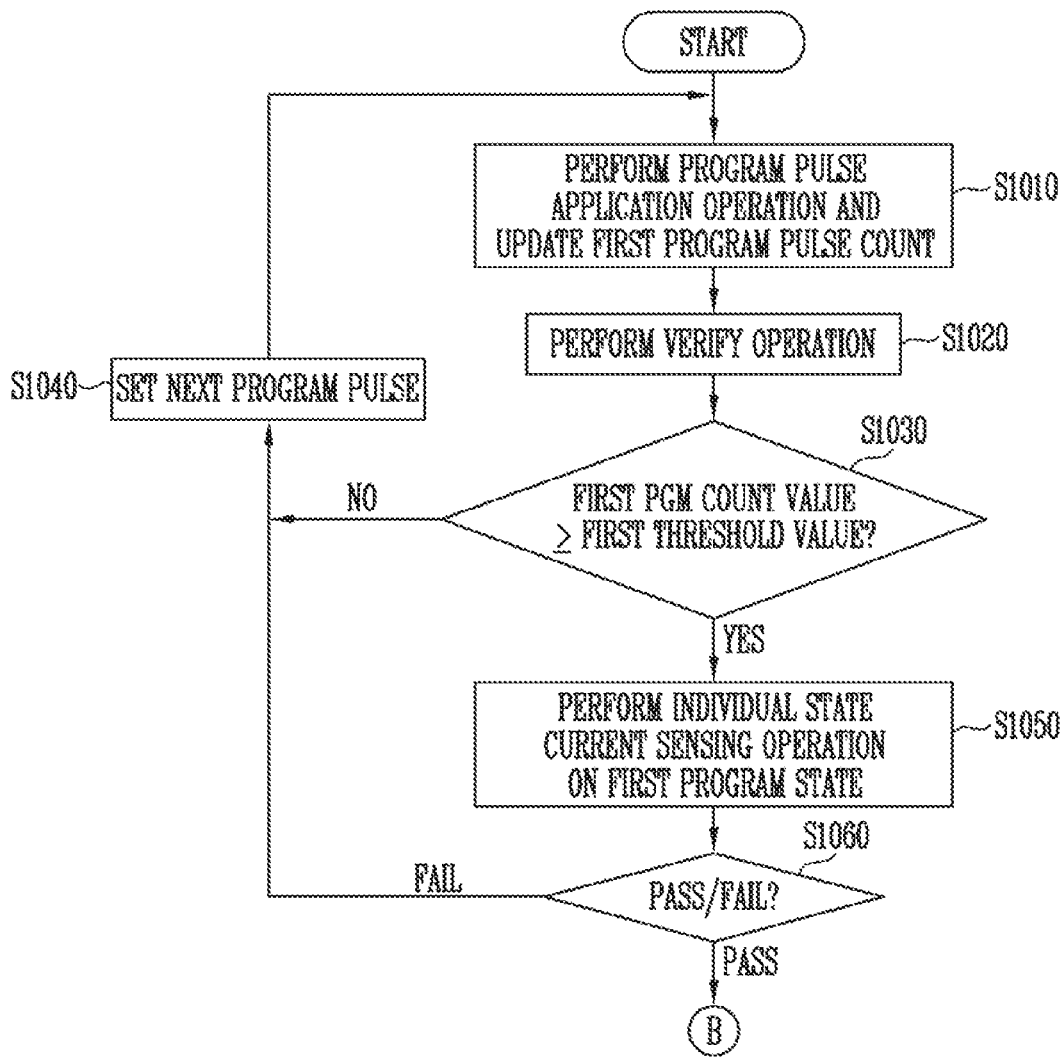
FIGS. 11 and 12 are flowcharts, illustrating a method for operating the semiconductor memory device, in accordance with an embodiment of the present disclosure.
Figure 12:
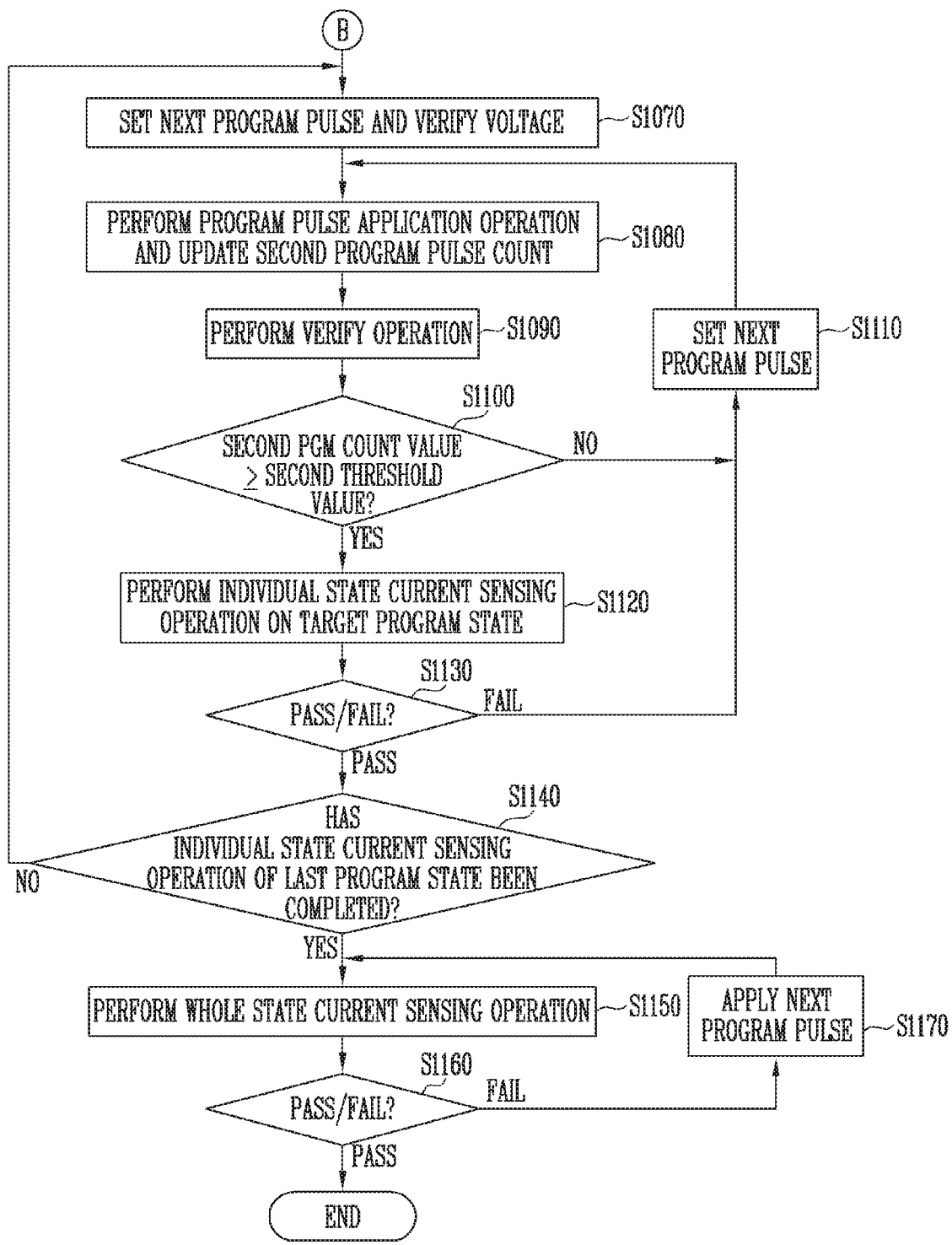

FIGS. 11 and 12 are flowcharts illustrating a method for operating the semiconductor memory device in accordance with an embodiment of the present disclosure.

The method will be described as follows with reference to FIGS. 1, 7, 8, 9, 11, and 12.

In the embodiment of the present disclosure, a case where a plurality of memory cells may be programmed to a plurality of program states P1 to P7, and program operations on the plurality of program states P1 to P7 may be sequentially performed will be described as an example.

In step S1010, a threshold voltage of memory cells that are connected to a bit line to which a program allow voltage is applied may be increased by applying a program pulse to a selected word line so as to perform a program operation. For example, the plurality of page buffers PB1 to PBm of the read/write circuit 130 temporarily store data DATA to be programmed, which is received from an external device, and control a potential level of corresponding bit lines BL1 to BLm based on the temporarily stored data DATA. The voltage generator 150 generates a program voltage Vpgm and a pass voltage Vpass. The program voltage Vpgm may be the first program pulse VP1 shown in FIG. 10. The address decoder 120 may apply the program voltage Vpgm to the selected word line, and may apply the pass voltage Vpass to unselected word lines. The first program pulse VP1 may be a start program pulse of an Incremental Step Pulse Program (ISPP) method. The program pulse counter 141 updates a first program pulse count value N_PGM_1 by counting a number of applied program pulses.

In step S1020, the voltage generator 150 generates a verify voltage Vverify and the pass voltage Vpass. The verify voltage Vverify may be the verify voltage VR1 shown in FIG. 10. The address decoder 120 may apply the verify voltage Vverify to the selected word line, and may apply the pass voltage Vpass to the unselected word lines. The plurality of page buffers PB1 to PBm of the read/write circuit 130 perform a verify operation, based on a current amount of the corresponding bit lines BL1 to BLm. The plurality of page buffers PB1 to PBm apply a program inhibit voltage to a corresponding bit line when a memory cell connected to the corresponding bit line has been completely programmed, based on a result of the verify operation, and may apply a program allow voltage to the corresponding bit line when the memory cell connected to the corresponding bit line has not been completely programmed, based a result of the verify operation.

In step S1030, the sensing mode controller 143 generates a current sensing mode control signal CSC_MD by comparing the first program pulse count value N_PGM_1 that is received from the program pulse counter 141 with a first threshold value.

For example, when the first program pulse count value N_PGM_1 is smaller than the first threshold value (NO), the current sensing circuit 160 skips an individual state current sensing operation corresponding to a first program state based on the sensing mode control signal CSC_MD. In step S1040, the control logic 1040 sets a next program pulse so as to perform a next program loop. The next program pulse may be a new program pulse increased by a step voltage from a just previously applied program pulse.

For example, when the first program pulse count value N_PGM_1 is equal to or greater than the first threshold value (YES), in step S1050, the current sensing circuit 160 performs the individual state current sensing operation on the first program state based on the sensing mode control signal CSC_MD. For example, the current sensing circuit 160 may generate a reference current based on an allow bit VRY_BIT<#> that is received from the control logic 140 in the individual state current sensing operation on the first program state, and output a pass signal PASS or a fail signal FAIL by comparing a reference voltage that is generated by the reference current with a sensing voltage VPB that is received from the page buffers PB1 to PBm that are included in the read/write circuit 130. More specifically, the current sensing circuit 160 may generate and output the pass signal PASS or the fail signal FAIL by comparing the sensing voltage VPB that is generated based on a value of the bit line sense latch 1314 of each of the page buffers in which the data is to be programmed, corresponding to the first program state, among the page buffers PB1 to PBm with the reference voltage that is generated by the reference current in the individual state current sensing operation on the first program state.

In step S1060, the control logic 140 determines whether a verify operation corresponding to the first program state has passed or failed by receiving the pass signal PASS or the fail signal FAIL from the current sensing circuit 160. For example, when the fail signal FAIL is received from the current sensing circuit 160 (FAIL), the semiconductor memory device re-performs the above-described steps from the step S1040.

When the pass signal PASS is received from the current sensing circuit 160 (PASS), the control logic 140 determines that the verify operation corresponding to the first program state has been passed. Accordingly, in step S1070, the control logic 1040 sets a next program pulse corresponding to a next program loop and a verify voltage corresponding to a next program state.

In step S1080, the threshold voltage of the memory cells that are connected to the bit line to which the program allow voltage is applied may be increased by applying a newly set program pulse to the selected word line. The voltage generator 150 generates the newly set program pulse and the pass voltage Vpass. The address decoder 120 may apply the program pulse that is generated by the voltage generator 150 to the selected word line, and may apply the pass voltage Vpass to the unselected word lines. The program pulse counter 141 may update a second program pulse count value N_PGM_2 by counting a number of program pulses applied after it is determined that the verify operation has been passed in the above-described step S1060.

In step S1090, the voltage generator 150 generates at least one newly set verify voltage and the pass voltage Vpass. The address decoder 120 may apply the verify voltage to the selected word line, and may apply the pass voltage Vpass to the unselected word lines. The plurality of page buffers PB1 to PBm of the read/write circuit 130 performs a verify operation based on a current amount of the corresponding bit lines BL1 to BLm. The plurality of page buffers PB1 to PBm apply the program inhibit voltage to a corresponding bit line when a memory cell connected to the corresponding bit line has been completely programmed, based on a result of the verify operation, and may apply the program allow voltage to the corresponding bit line when the memory cell connected to the corresponding bit line has not been completely programmed, based a result of the verify operation.

In step S1100, the sensing mode controller 1430 generates a current sensing mode control signal CSC_MD by comparing the second program pulse count value N_PGM_2 that is received from the program pulse counter 141 with a second threshold value. In an example, the second threshold value may correspond to one to four times.

For example, when the second program pulse count value N_PGM_2 is smaller than the second threshold value (NO), the current sensing circuit 160 skips an individual state current sensing operation corresponding to a target program state among second to seventh program states based on the sensing mode control signal CSC_MD. In step S1110, the control logic 1040 sets a next program pulse so as to perform a next program loop. The next program pulse may be a new program pulse increased by a step voltage from a just previously applied program pulse.

For example, when the second program pulse count value N_PGM_2 is equal to or greater than the second threshold value (YES), in step S1120, the current sensing circuit 160 performs the individual state current sensing operation corresponding to the target program state among the second to seventh program states based on the sensing mode control signal CSC_MD. For example, the current sensing circuit 160 may generate a reference current based on the allow bit VRY_BIT<#> that is received from the control logic 140 in the individual state current sensing operation on the target program state, and output a pass signal PASS or a fail signal FAIL, which corresponds to the target program state, by comparing a reference voltage that is generated by the reference current with a sensing voltage VPB that is received from the page buffers PB1 to PBm that are included in the read/write circuit 130. More specifically, the current sensing circuit 160 may generate and output the pass signal PASS or the fail signal FAIL by comparing the sensing voltage VPB that is generated based on a value of bit line sense latch 1314 of each of page buffers in which data to be programmed, which corresponds to the target program state, among the page buffers PB1 to PBm with the reference voltage that is generated by the reference current in an individual state current sensing operation on the second program state.

In step S1130, the control logic 140 determines whether a verify operation corresponding to the target program state has passed or failed by receiving the pass signal PASS or the fail signal FAIL from the current sensing circuit 160. For example, when the fail signal FAIL is received from the current sensing circuit 160 (FAIL), the semiconductor memory device re-performs the above-described steps from the step S1110.

When the pass signal PASS is received from the current sensing circuit 160 (PASS), in step S1140, the control logic 140 may check whether the individual state current sensing operation, which has been performed up to now from the step S1120, is an individual state current sensing operation on a last program state (e.g., P7). For example, when it is determined that the individual state current sensing operation on the last program state (e.g., P7) has not been performed up to now (NO), the semiconductor memory device re-performs the above-described steps from the step S1070.

When it is determined that the individual state current sensing operation on the last program state (e.g., P7) has been performed in the step S1120 (YEST), in step S1150, the current sensing circuit 160 performs a whole state current sensing operation. For example, the current sensing circuit 160 may generate a reference current based on an allow bit VRY_BIT<#> that is received from the control logic 140 in the whole state current sensing operation, and output a pass signal PASS or a fail signal FAIL, which corresponds to the target program state, by comparing a reference voltage that is generated by the reference current with a sensing voltage VPB that is received from the page buffers PB1 to PBm that are included in the read/write circuit 130. More specifically, the current sensing circuit 160 may generate and output the pass signal PASS or the fail signal FAIL by comparing the sensing voltage VPB that is generated based on a value of the bit line sense latch 1314 of each of the page buffers PB1 to PBm in a current sensing operation on the first to seventh program states with the reference voltage that is generated by the reference current.

In step S1160, the control logic 140 determines whether a verify operation corresponding to all the program states has passed or failed by receiving the pass signal PASS or the fail signal FAIL from the current sensing circuit 160. For example, when the fail signal FAIL is received from the current sensing circuit 160 (FAIL), in step S1170, a new program pulse may be applied to the selected word line, and then the semiconductor memory device re-performs the above-described steps from the step S1150.

When the pass signal PASS is received from the current sensing circuit 160 (PASS), a program operation on a page corresponding to the selected word line may be ended.

Figure 13:
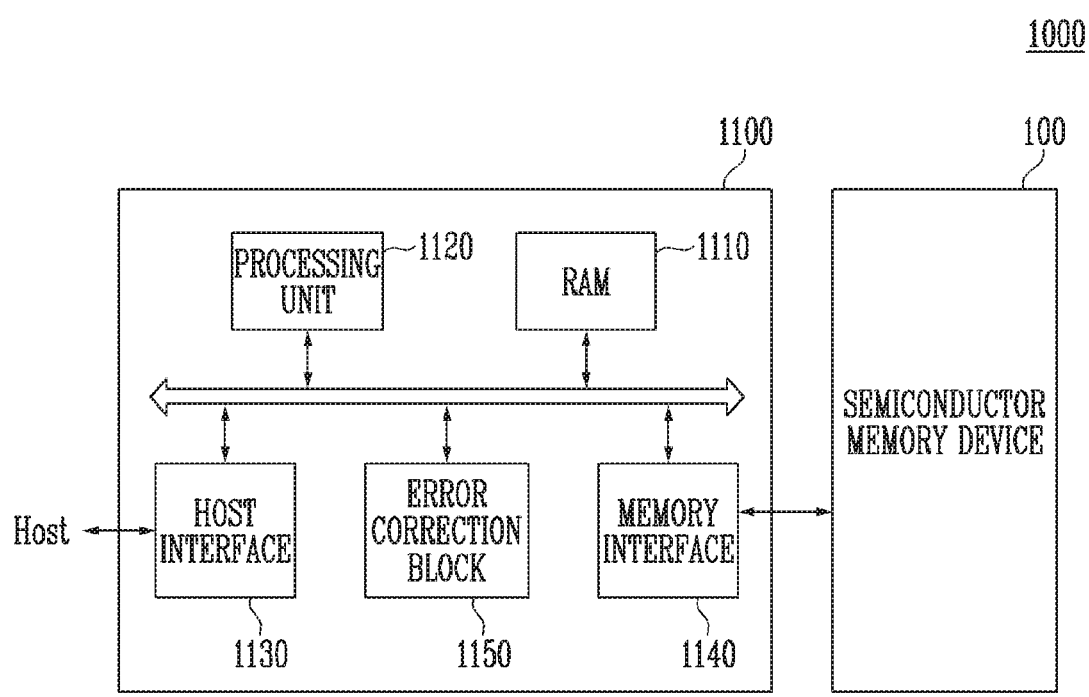
FIG. 13 is a block diagram, illustrating an embodiment of the memory system with the semiconductor memory device that is shown in FIG. 1.

FIG. 13 is a block diagram, illustrating an embodiment 1000 of the memory system with the semiconductor memory device that is shown in FIG. 1.

Referring to FIG. 13, the memory system 1000 may include a semiconductor memory device 100 and a controller 1100. The semiconductor memory device 100 may be the semiconductor memory device 100 described with reference to FIG. 1. Hereinafter, overlapping descriptions will be omitted.

The controller 1100 may be connected to a host Host and the semiconductor memory device 100. The controller 1100 accesses the semiconductor memory device 100 based on a request from the host Host. For example, the controller 1100 controls read, write, erase, and background operations of the semiconductor memory device 100. The controller 1100 provides an interface between the semiconductor memory device 100 and the host Host. The controller 1100 drives firmware be for controlling the semiconductor memory device 100.

The controller 1100 may include a random access memory (RAM) 1110, a processing unit 1120, a host interface 1130, a memory interface 1140, and an error correction block 1150. The RAM 1110 may be used as at least one of a working memory of the processing unit 1120, a cache memory between the semiconductor memory device 100 and the host Host, and a buffer memory between the semiconductor memory device 100 and the host Host. The processing unit 1120 controls overall operations of the controller 1100. In addition, the controller 1100 may temporarily store program data provided from the host Host in a write operation.

The host interface 1130 may include a protocol for exchanging data between the host Host and the controller 1100. In an exemplary embodiment, the controller 1100 communicates with the host Host through at least one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and a private protocol.

The memory interface 1140 interfaces with the semiconductor memory device 100. For example, the memory interface 1140 may include a NAND interface or a NOR interface.

The error correction block 1150 detects and corrects an error of data that is received from the semiconductor memory device 100 by using an error correction code (ECC). The processing unit 1120 may adjust a read voltage, based on an error detection result of the error correction block 1150, and control the semiconductor memory device 100 to perform re-reading. In an exemplary embodiment, the error correction block 1150 may be provided as a component of the controller 1100.

The controller 1100 and the semiconductor memory device 100 may be integrated into one semiconductor device. In an exemplary embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card, such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD Card (SD, miniSD, microSD or SDHC), or a Universal Flash Storage (UFS).

The controller 1100 and the semiconductor memory device 100 may be integrated into one semiconductor device to constitute a semiconductor drive (solid state drive (SSD)). The semiconductor drive SSD may include a storage device configured to store data in a semiconductor memory. If the memory system 1000 is used as the semiconductor drive SSD, the operating speed of the host Host connected to the memory system 1000 can be remarkably improved.

As another example, the memory system 1000 may be provided as one of various components of an electronic device, such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the semiconductor memory device 100 or the memory system 1000 may be packaged in various forms. For example, the semiconductor memory device 100 or the memory system 1000 may be packaged in a manner, such as Package On Package (PoP), Ball Grid Arrays (BGAs), Chip Scale Packages (CSPs), Plastic Leaded Chip Carrier (PLCO), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 14:
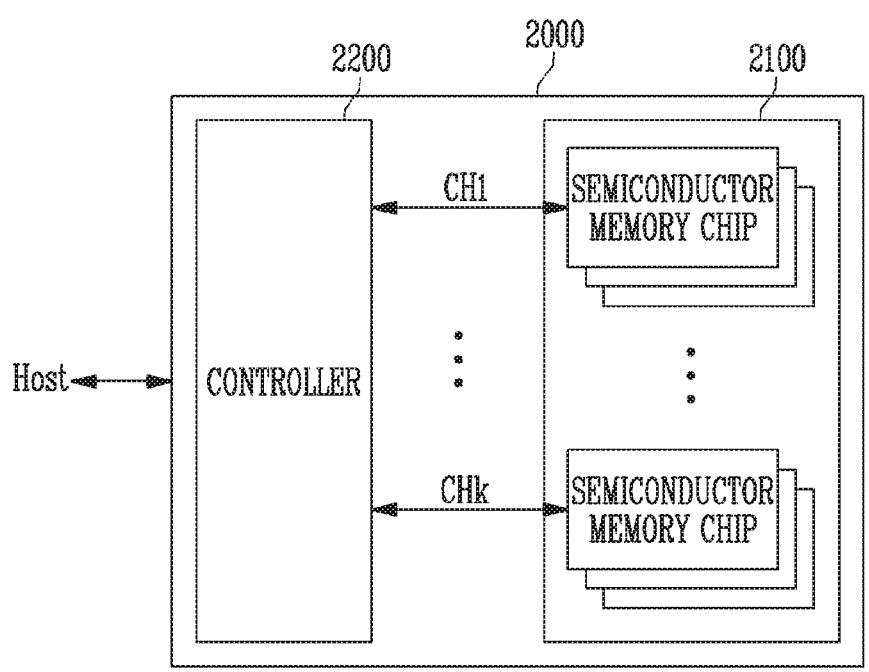
FIG. 14 is a block diagram, illustrating an application example of the memory system shown in FIG. 13.

FIG. 14 is a block diagram, illustrating an application example of the memory system that is shown in FIG. 13.

Referring to FIG. 14, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 14, there is illustrated a case where the plurality of groups communicate with the controller 2200 respectively through first to kth channels CH1 to CHk. Each semiconductor memory chip may be configured and operated identically to the semiconductor memory device 100 described with reference to FIG. 1.

Each group communicates with the controller 2200 through one common channel. The controller 2200 may be configured identically to the controller 1100 described with reference to FIG. 13. The controller 2200 controls the plurality of memory chips of the semiconductor memory device 2100 through the plurality of channels CH1 to CHk.

Figure 15:
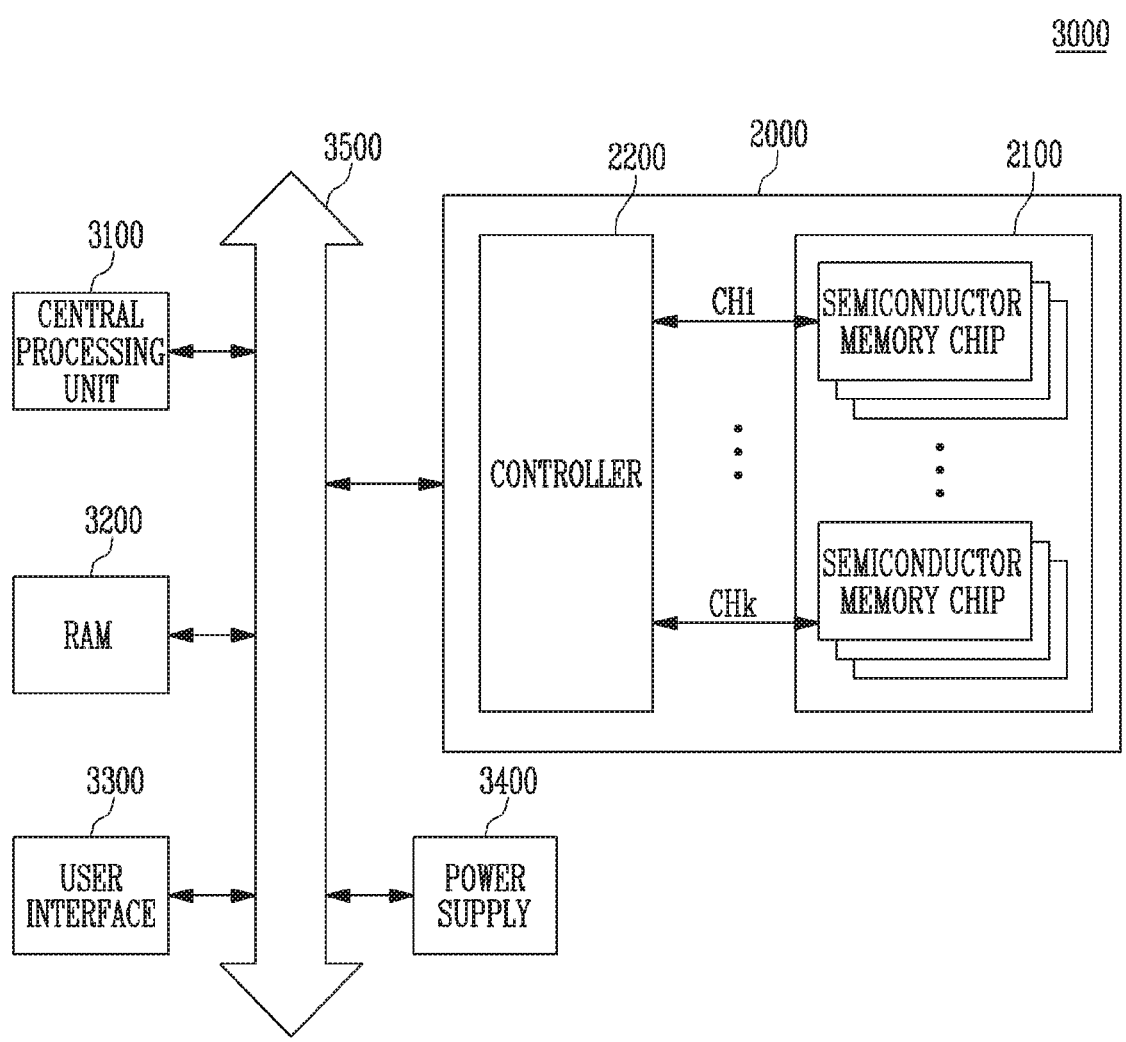
FIG. 15 is a block diagram, illustrating a computing system with the memory system, described with reference to FIG. 14.

FIG. 15 is a block diagram, illustrating a computing system with the memory system, described with reference to FIG. 14.

Referring to FIG. 15, the computing system 3000 may include a central processing unit 3100, a RAM 3200, a user interface 3300, a power supply 3400, a system bus 3500, and a memory system 2000.

The memory system 2000 may be electrically connected to the central processing unit 3100, the RAM 3200, the user interface 3300, and the power supply 3400 through the system bus 3500. Data supplied through user interface 3300 or data processed by the central processing unit 3100 may be stored in the memory system 2000.

In FIG. 15, there is illustrated a case where the semiconductor memory device 2100 is connected to the system bus 3500 through the controller 2200. However, the semiconductor memory device 2100 may be directly connected to the system bus 3500. The function of the controller 2200 may be performed by the central processing unit 3100 and the RAM 3200.

In FIG. 15, there is illustrated a case where the memory system 2000 described with reference to FIG. 14 is provided. However, the memory system 2000 may be replaced by the memory system 1000 described with reference to FIG. 13. In an exemplary embodiment, the computing system 3000 may include both of the memory systems 1000 and 2000 described with reference to FIGS. 13 and 14.

In accordance with the present disclosure, an individual state current sensing operation may be skipped during a set program loop in a program operation of the semiconductor memory device, so that current consumption can be prevented.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor memory device comprising:
a memory cell array with a plurality of memory cells with each of at least a portion of the plurality of memory cells configured to be programmed to one of a plurality of program states;
a peripheral circuit configured to perform a program operation on selected memory cells among the plurality of memory cells through a plurality of program loops each including a program pulse application operation and a verify operation;
a current sensing circuit configured to determine a verify result of each of the plurality of program states by performing an individual state current sensing operation on the selected memory cells among the memory cells; and
a control logic configured to control the current sensing circuit to perform the individual state current sensing operation after the verify operation is performed, when a number of program loops corresponding to each of the plurality of program states, among the plurality of program loops, that are performed is greater than a threshold value,
wherein the verify operation includes sensing a current of bit lines connected to the selected memory cells when a verify voltage is applied to the selected memory cells, and
wherein the individual state current sensing operation includes generating a pass signal or a fail signal that indicates the verify result of each of the plurality of program states based on a result of comparing a reference voltage with a sensing voltage corresponding to the current of the bit lines.

2. The semiconductor memory device of claim 1, wherein the control logic:
controls the plurality of program loops to be sequentially performed by controlling the peripheral circuit, and
controls the current sensing circuit to skip the individual state current sensing operation while initial m program loops among the plurality of program loops are being performed, wherein m is a positive integer greater than 1.

3. The semiconductor memory device of claim 1, wherein the control logic:
controls the plurality of program loops that correspond to the plurality of program states to be sequentially performed,
controls the peripheral circuit to perform program loops that correspond to a first program state among the plurality of program loops in a program operation on the first program state among the plurality of program states, and
controls the current sensing circuit to skip the individual state current sensing operation that corresponds to the first program state during the initial m program loops among the program loops that correspond to the first program state.

4. The semiconductor memory device of claim 3, wherein the control logic controls the current sensing circuit to perform the individual state current sensing operation that corresponds to the first program state from an (m+1)th program loop among the program loops that correspond to the first program state.

5. The semiconductor memory device of claim 3, wherein the control logic:
controls the peripheral circuit to sequentially perform program operations on second to nth program states among the plurality of program states,
controls peripheral circuit to sequentially perform program loops that correspond to any one program state among the second to nth program states among the plurality of program loops, in a program operation that corresponds to the one program state, and
controls the current sensing circuit to skip the individual state current sensing operation that corresponds to the one program state during initial k program loops among the program loops that correspond to the one program state, wherein k is a positive integer greater than 1.

6. The semiconductor memory device of claim 5, wherein the control logic controls the current sensing circuit to perform the individual state current sensing operation that corresponds to the one program state from a (k+1)th program loop among the program loops that correspond to the one program state.

7. The semiconductor memory device of claim 1, wherein the peripheral circuit includes a plurality of page buffers connected to the bit lines, and
wherein the plurality of page buffers supplies a sensing current to the bit lines to sense a threshold voltage of the selected memory cells in the verify operation, senses a current amount of the bit lines and then latches the sensed current amount as sensing data, and generates the sensing voltage by using the latched sensing data.

8. The semiconductor memory device of claim 7, wherein the current sensing circuit generates the reference voltage based on an allow bit that is received from the control logic in the individual state current sensing operation, and generates the pass signal or the fail signal by comparing the reference voltage with the sensing voltage.

9. The semiconductor memory device of claim 8, wherein the control logic determines whether the verify operation that corresponds to each of the plurality of program states has been completed, based on the pass signal or the fail signal.

10. The semiconductor memory device of claim 1, wherein the control logic includes:
a program pulse counter configured to generate program pulse count values that correspond to each of the plurality of program states by counting a number of times a program pulse is applied to the selected word line in a program operation that corresponds to each of the plurality of program states, and
a sensing mode controller configured to generate a current sensing control signal for determining a sensing mode of the current sensing circuit, based on the program pulse count values.

11. The semiconductor memory device of claim 10, wherein the current sensing circuit performs the individual state current sensing operation or skips the individual state current sensing operation, based on the current sensing control signal.

12. A semiconductor memory device comprising:
a memory cell array with a plurality of memory cells with each of at least a portion of the plurality of memory cells configured to be programmed to one of first to nth program states, wherein n is a positive integer greater than 2;
a peripheral circuit configured to perform a program operation on selected memory cells among the plurality of memory cells through a plurality of program loops each including a program pulse application operation, a verify operation and an individual state current sensing operation;

a current sensing circuit configured to perform the individual state current sensing operations corresponding to each of the first to nth program states on the selected memory cells among the memory cells; and a control logic configured to control the peripheral circuit to perform the program operation, and control the current sensing circuit to skip the individual state current sensing operation during initial m program loops corresponding to each of the first to nth program states among the plurality of program loops, wherein m is a positive integer greater than 1, wherein the verify operation includes sensing a current of bit lines connected to the selected memory cells when a verify voltage is applied to the selected memory cells, and wherein the individual state current sensing operation includes generating a pass signal or a fail signal that indicates a verify result of each of the first to nth program states based on a result of comparing a reference voltage with a sensing voltage corresponding to the current of the bit lines.

13. The semiconductor memory device of claim 12, wherein the control logic:
controls the peripheral circuit to sequentially perform the plurality of program loops that correspond to the first to nth program states in the program operation,
controls the peripheral circuit to sequentially perform program loops that correspond to any one program state among the second to nth program states among the plurality of program loops, in a program operation that corresponds to the one program state during the program operation, and
controls the current sensing circuit to skip the individual state current sensing operation that corresponds to the one program state during an initial k program loops among the program loops that correspond to the one program state, wherein k is a positive integer greater than 1.

14. The semiconductor memory device of claim 12, wherein the peripheral circuit includes a plurality of page buffers that are connected to the bit lines, and
wherein the plurality of page buffers supplies a sensing current to the bit lines to sense a threshold voltage of the selected memory cells in the verify operation during the program operation, senses a current amount of the bit lines and then latches the sensed current amount as sensing data, and generates the sensing voltage by using the latched sensing data.

15. The semiconductor memory device of claim 14, wherein the current sensing circuit generates the reference voltage based on an allow bit that is received from the control logic in the individual state current sensing operation, and generates the pass signal or the fail signal by comparing the reference voltage with the sensing voltage.

16. The semiconductor memory device of claim 15, wherein the control logic determines whether the verify operation that corresponds to each of the first to nth program states has been completed, based on the pass signal or the fail signal.

17. The semiconductor memory device of claim 12, wherein the control logic includes:
a program pulse counter configured to generate program pulse count values that correspond to each of the plurality of program states by counting a number of times a program pulse is applied to the selected word line in a program operation that corresponds to each of the first to nth program states, and
a sensing mode controller configured to generate a current sensing control signal to determine a sensing mode of the current sensing circuit, based on the program pulse count values.

18. The semiconductor memory device of claim 17, wherein the current sensing circuit performs the individual state current sensing operation or skips the individual state current sensing operation, based on the current sensing control signal.

19. A method for operating a semiconductor memory device including a plurality of memory cells, the method comprising:
performing a first program operation that corresponds to a first program state among a plurality of program states; and
performing a second program operation that corresponds to a second program state of threshold voltage distribution is higher than that of the first program state, after the first program operation is completed,
wherein each of initial m (m is a positive integer greater than 1) program loops corresponding to each of the first and second program states includes a program pulse application operation and a verify operation,
wherein each of (m+1)th to last program loops corresponding to each of the first and second program states includes the program pulse application operation, the verify operation, and an individual state current sensing operation that corresponds to each of the first and second program states,
wherein the verify operation includes sensing a current of bit lines connected to the plurality of memory cells when a verify voltage is applied to the plurality of memory cells, and
wherein the individual state current sensing operation includes generating a pass signal or a fail signal that indicates a verify result of each of the first and second program states based on a result of comparing a reference voltage with a sensing voltage corresponding to the current of the bit lines.

20. The method of claim 19, wherein the individual state current sensing operation that corresponds to the first program state is skipped in each of the initial m program loops.

21. The method of claim 19, wherein a plurality of second program loops are sequentially performed in the second program operation,
wherein each of initial k (k is a positive integer greater than 1) program loops among the plurality of second program loops includes the program pulse application operation and the verify operation, and
wherein each of (k+1)th to last program loops among the plurality of second program loops includes the program pulse application operation, the verify operation, and an individual state current sensing operation that corresponds to the second program state.

* * * * *